US011544896B2

(12) United States Patent
Lasram et al.

(10) Patent No.: US 11,544,896 B2
(45) Date of Patent: Jan. 3, 2023

(54) SPATIAL AND TEMPORAL UPSAMPLING TECHNIQUES FOR SIMULATED SENSOR DATA

(71) Applicant: Zoox, Inc., Foster City, CA (US)

(72) Inventors: Anas Lasram, South San Francisco, CA (US); James Graham Dolan, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 17/321,228

(22) Filed: May 14, 2021

(65) Prior Publication Data

US 2022/0366640 A1 Nov. 17, 2022

(51) Int. Cl.
G06T 15/20 (2011.01)
G06T 17/20 (2006.01)
G06F 30/23 (2020.01)
G06T 7/70 (2017.01)
G06T 3/40 (2006.01)

(52) U.S. Cl.
CPC .......... *G06T 15/205* (2013.01); *G06F 30/23* (2020.01); *G06T 3/4007* (2013.01); *G06T 7/70* (2017.01); *G06T 17/20* (2013.01)

(58) Field of Classification Search
CPC ....... G06T 15/205; G06T 3/4007; G06T 7/70; G06T 17/20; G06F 30/23
See application file for complete search history.

(56) References Cited

U.S. PATENT DOCUMENTS

| 2009/0167763 A1* | 7/2009 | Waechter ............. G06T 17/005 345/426 |
| 2016/0210775 A1 | 7/2016 | Alaniz et al. |
| 2016/0220905 A1 | 8/2016 | Harada et al. |

(Continued)

FOREIGN PATENT DOCUMENTS

| JP | 2019208212 A | 12/2019 |
| WO | WO2018000037 | 1/2018 |

OTHER PUBLICATIONS

Elmquist A, Serban R, Negrut D. A sensor simulation framework for training and testing robots and autonomous vehicles. Journal of Autonomous Vehicles and Systems. Apr. 1, 2021;1(2). (Year: 2021).*

(Continued)

*Primary Examiner* — Samantha (Yuehan) Wang
(74) *Attorney, Agent, or Firm* — Lee & Hayes, P.C.

(57) ABSTRACT

A sensor simulation system may generate sensor data for use in simulations by rendering two-dimensional views of a three-dimensional simulated environment. In various examples, the sensor simulation system uses sensor dependency data to determine specific views to be re-rendered at different times during the simulation. The sensor simulation system also may generate unified views with multi-sensor data at each region (e.g., pixel) of the two-dimensional view for consumption by different sensor types. A hybrid technique may be used in some implementations in which rasterization is used to generate a view, after which ray tracing is used to align the view with a particular sensor. Spatial and temporal upsampling techniques also may be used, including depth-aware and velocity-aware analyses for simulated objects, to improve view resolution and reduce the frequency of re-rendering views.

16 Claims, 16 Drawing Sheets

(56) References Cited

U.S. PATENT DOCUMENTS

| | | | |
|---|---|---|---|
| 2016/0246061 A1 | 8/2016 | Bickerstaff et al. | |
| 2017/0116723 A1 | 4/2017 | Aughey | |
| 2018/0376292 A1* | 12/2018 | Ivanov | G01S 5/0252 |
| 2020/0074652 A1 | 3/2020 | Yan et al. | |
| 2020/0159239 A1 | 5/2020 | Li et al. | |
| 2020/0218979 A1* | 7/2020 | Kwon | G06N 3/08 |
| 2020/0301799 A1 | 9/2020 | Manivasagam et al. | |
| 2021/0018916 A1* | 1/2021 | Thakur | G07C 5/0808 |
| 2021/0125395 A1 | 4/2021 | Croxford et al. | |
| 2021/0125414 A1* | 4/2021 | Berkebile | G06T 19/006 |
| 2021/0327024 A1 | 10/2021 | Wang et al. | |

OTHER PUBLICATIONS

Office Action for U.S. Appl. No. 17/321,236, dated Dec. 24, 2021, Lasram, "Mapping Simulated Sensors To Simulated Environment Views", 19 pages.

PCT Search Report and Written Opinion dated Sep. 14, 2022 for PCT application No. PCT/US22/29044, 10 pages.

Elmquist A, Serban R, Negrut D. A sensor simulation framework for training and testing robots and autonomous vehicles. Journal of Autonomous Vehicles and Systems. Apr. 1, 2021 ;1 (2). (Year: 2021) 10 pages.

Office Action for U.S. Appl. No. 17/321,274, dated Oct. 6, 2022, Lasram, "Simulation View Generation Based on Simulated Sensor Operations" 16 pages.

* cited by examiner

SPATIAL AND TEMPORAL UPSAMPLING TECHNIQUES FOR SIMULATED SENSOR DATA

BACKGROUND

Simulated data and simulations can be used to test and validate the features and functionalities of systems, including features and functionalities that may be otherwise prohibitive to test in the real world (e.g., due to safety concerns, limitations on time, repeatability, etc.). For example, autonomous vehicles and other moving vehicles may use driving simulations to test and improve passenger safety, vehicle decision-making, sensor data analysis, and route optimization. However, driving simulations that accurately reflect real-world scenarios may be difficult to create, as data used to create such simulations may be noisy, inconsistent, and/or incomplete. Additionally, driving simulations may involve multiple different systems and components interacting in a real-time simulated environment, which may be resource and computationally expensive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
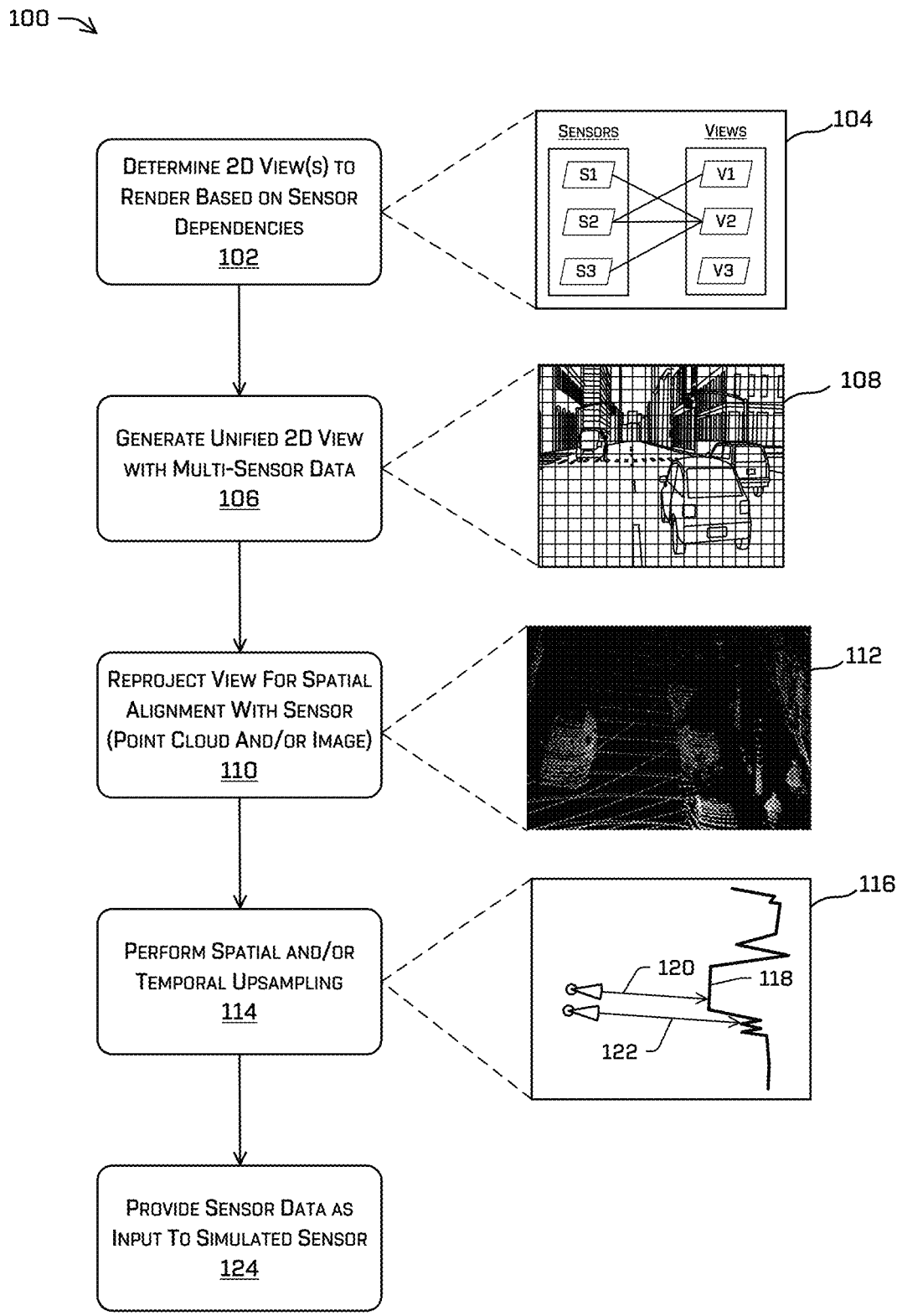
FIG. 1 illustrates an example process of generating and using views of a simulated environment to provide data to simulated sensors, in accordance with one or more implementations of the disclosure.

This disclosure relates to techniques for generating sensor data and providing the sensor data to sensors operating within software-based simulations. A sensor simulation system (which also may be referred to as a sensor engine) may render two-dimensional (2D) views based on three-dimensional (3D) simulation environments, and may use the 2D views to determine sensor data for simulated sensors based on sensor locations, orientations, and/or fields of view of the simulated sensors within the simulation. Various examples described herein relate to performing driving simulations for autonomous vehicles, in which a simulated autonomous vehicle includes multiple different simulated sensors installed at different locations on the vehicle, in which the simulated sensors are configured to detect and process different types of input data from the simulated environment. As a simulated vehicle traverses the simulated environment, the simulated sensors may move based on the movement of the vehicle and/or independently of the vehicle. Simulated agents and other dynamic objects in the simulated environment also may move relative to the simulated vehicle and sensors. The various techniques described herein relate to generating accurate, efficient, and high-resolution sensor data, and providing the sensor data as input to the simulated sensors of a simulated vehicle during real-time or offline driving simulations.

The purpose of driving simulations can be to test and validate the responses of the simulated vehicle to a variety of different simulated scenarios for later use in the real world. For example, driving simulations may model normal or abnormal driving conditions and/or vehicle conditions, using a variety of simulated environments and simulated objects or agents. Driving simulations may model various different traffic conditions, environmental conditions, roadway obstructions, accidents, etc., to test and validate passenger safety, vehicle routing, decision-making, efficiency, etc. Certain driving simulations may test the responses of a simulated vehicle to defective and/or faulty sensors on the vehicle. Some driving simulations may be used to test individual components or systems of the simulated vehicle (e.g., a perception component, a decision-making or planning component, etc.). The same or different driving simulations may test the simulated vehicle as a whole including interactions between the various components or systems of the vehicle. Simulations may include scenarios which rarely occur in the real world, such as collisions with other objects, violations of traffic rules, etc., yet still require testing to validate safe operation, as well as provide a mechanism to consistently test variations for control algorithms keeping other factors constant.

In various driving simulations, a simulated vehicle may interact with additional simulated agents and/or other objects in a simulated environment. In such simulations, the simulated agents and/or objects in the environment may include software-based objects controlled based on artificial intelligence(s) and/or other algorithms that can react to the actions of the simulated vehicle, while the simulated vehicle also reacts to the simulated agents/objects and to the conditions of the simulated environment. Driving simulations provide highly realistic testing and validation for real-world driving scenarios, by executing all of the simulated components (e.g., simulated vehicle(s), objects, and environment) concurrently within the simulated environment and supporting communications and interactions between the simulated components.

However, generating and providing realistic, accurate, and high-resolution input data to sensors during virtual driving simulations may be resource intensive and computationally expensive. These limitations may preclude the number of the simulation scenarios that can be executed in certain computing environments, may limit the number of different sensors that can be realistically simulated, and/or may prevent certain simulations from being performed in real-time. For example, when executing a virtual driving simulation environment, a simulation system may continuously generate and provide sensor data separately for each simulated sensor within the simulation. Each sensor data generation may require rendering a new view which can involve significant computational resources by the sensor engine and/or simulation system.

In order to address the limitations of conventional systems for generating and providing sensor data based on 3D simulated environments, certain techniques described herein relate to using sensor dependency data to determine specific views (which also may be referred to as image views) to be rendered at different times during a simulation. Additional techniques described herein relate to generating "unified" two-dimensional views that include multiple types of sensor data (e.g., image data, depth data, lidar data, radar data, etc.) associated with each region (e.g., pixel) of the view, which may be used to provide sensor data for different types of sensors in the simulated environment. Additional techniques relate to a hybrid system that includes a GPU and CPU operating in collaboration to execute a driving simulation (or other simulation), in which the GPU is used to render the 2D view of a simulated environment (e.g., via rasterization), and preform ray tracing to spatially and/or temporally align and/or upsample the view for the specific simulated sensor location, angle, and field of view, and the CPU is used to determine the views to be rendered by the GPU and to provide additional sensor data post-processing and other simulation compute functionality. Further techniques described herein relate to performing spatial and/or temporal upsampling, including upsampling based on depth data, object identifiers, and/or velocities within the simulation, to improve view resolution and reduce the frequency at which views are re-rendered. As described in the various examples below, the techniques and components described herein may be implemented individually or in combination to more efficiently and accurately provide realistic and high-resolution input data to sensors executing in simulated environments.

FIG. 1 illustrates an example process 100 of generating and using 2D views of a simulated environment, and using the 2D views to generate sensor data to provide as input to simulated sensors within the simulated environment. In various examples, some or all operations of the example process 100 may be performed by computing devices configured as driving simulation system(s) (e.g., virtual driving simulators), other types of simulated systems, and/or sensor engines configured to generate and provide sensor input data to simulation systems. Process 100, and various other examples herein, are described in reference to driving simulations during which a simulated vehicle with one or more sensors traverses through a simulated environment. During simulation, the vehicle sensors are provided with sensor input data representing the simulated environment and the simulated agents/objects therein, and the simulated vehicle responds to the sensor input data by controlling the vehicle. However, it can be understood from the context of this disclosure that techniques described herein are not limited to driving simulation systems, and may be implemented in a similar or identical manner within other systems, including but not limited to video gaming systems, virtual reality systems, non-driving simulation systems (e.g., flight simulators), and/or image/sensor data processing systems operating in physical (e.g., non-simulated) environments.

At operation 102, a sensor engine determines one or more 2D views of the 3D simulated environment to be rendered at a particular time during the simulation, based on the sensor dependencies of the simulated sensors operating in the simulation. The sensor engine, described below in more detail, may include one or more computing devices (e.g., computing device(s) 202 and/or 932) associated with a driving simulation system. In some cases, a simulated sensor may refer to a sensor system of a simulated vehicle executing within a driving simulation. Simulated sensors may include various different types of sensor systems (e.g., cameras, lidar sensors, radar sensors, etc.) configured to detect or receive sensor data from simulated environments. In operation 102, the sensor engine may retrieve, for each sensor in the simulated environment, a set of sensor dependency data identifying the input data that is to be provided to the sensor, relative to the simulated environment. For example, sensor dependency data may include the position, orientation angle, and/or field of view of the sensor within the simulated environment. These factors may determine which 2D view(s) can and cannot be used to generate sensor data to provide as input to the sensor. Additionally, sensor dependency data may include the type of data that the sensor is configured to detect, and may include any combination of physical properties of the objects within the simulated environment. For instance, image sensors (e.g., cameras) can be configured to detect light and color data from the simulated environment, radar sensors may be configured to detect a distance of objects from the sensor (which may be referred to as depth from the perspective of the sensor) and/or object velocity data, and lidar sensors may be configured to detect data, material properties (e.g., material type/composition, reflectance, roughness, etc.), and so on. Other types of sensors may be configured to detect additional or alternative physical properties of (or emanated by) the objects, such as heat, brightness, sound, movement, wind, moisture, etc.

Along with the sensor dependency data, the sensor engine in operation 102 may retrieve data relating to the 2D views currently or previously rendered within the simulation. The data relating to the 2D views may include the "position" of the 2D view within the 3D simulated environment, such as the focal point and/or angle or orientation of the 2D view, as well as the type(s) of data stored in the 2D view (e.g., types of sensor data such as light, color, depth, object ID, velocity, material data, etc.). Additionally, as depicted in box 104, sensors may be mapped to, or otherwise associated with, views during the execution of a simulation, and the view data retrieved in operation 102 may include data identifying which views are used (or could be used) to provide input data to the various sensors.

The sensor engine also may retrieve and analyze various timing data and/or movements of the simulated objects in operation 102, within the context of the current simulation. For example, relevant timing data may include the sensor execution rates (which also may be referred to as sampling rates or firing rates) of each sensor operating in the simulation, and the rendering times/rates associated with the different 2D views generated for the simulation. The sensor engine also may determine the capacities of the available GPU(s) or other processors for rendering 2D views (e.g., cores, GPU speed, storage, current rendering backlog, latency, network speed) and/or the capacities of the available CPU(s) or other processors to perform pre-processing and post-processing operations in connection with rendering views and generating sensor data by the GPU. Additionally, the sensor engine may receive object movement data in operation 102, including the velocity and direction of travel of the simulated vehicle, and the velocity and direction of other simulated agents/objects in the simulation.

Based on the sensor dependency data and/or other simulation data in operation 102, the sensor engine may apply one or more heuristics-based algorithms and/or machine-learning models to determine which view(s) will be rendered at various different times during the simulation. In some examples, the sensor engine may determine a single view to render in operation 102, or may determine a priority listing of the existing views and/or new views to be created, based on the sensor dependencies, view data, mapping data, etc. The view(s) selected by the sensor engine may be provided to GPU for rendering, after which the updated rendered views may be incorporated into the simulation system and used as input data by the simulated sensors.

As an example, in operation 102 the sensor engine may apply an algorithm that selects for rendering (or updating/re-rendering) the existing 2D view that provides sensor input data for the greatest number of sensors and/or highest priority sensors. As another example, the algorithm of the sensor engine may select for re-rendering the existing 2D view that provides sensor input data for at least one sensor, and may prioritize the 2D views in order of the oldest generated (e.g., most stale) current view. In still other examples, the algorithm of the sensor engine may rotate the re-rendering of existing 2D views, while skipping or weighting views based on number of sensors mapped to the view, the direction of the movement of the simulated vehicle toward or away from each view, the number of simulated agents and/or other dynamic objects within each view, etc. It can be understood that these example algorithms may be applied by the sensor engine individually or in any combination, and may be modified based on any additional factors associated with the sensors and/or views described herein.

Additionally, in some examples the sensor engine in operation 102 may perform a time-based analysis for the simulation, to determine whether a view scheduled for rendering (e.g., an initial rendering or a re-rendering to update the view) will have the same value or relevance at the time when the view is projected to be integrated into the simulated environment. For instance, the sensor engine may determine an anticipated rendering latency for generating the view (e.g., GPU rendering time plus pre- and post-processing), and may determine based on the movement of the simulated vehicle and/or sensors, which sensors will use the updated view after it is rendered.

At operation 106, the sensor engine may generate a unified 2D view of the simulated 3D environment, including multiple different types of sensor data corresponding to different physical properties of the simulated environment. In some examples, the 2D view generated may correspond to a view selected by the sensor engine in operation 102. As used herein, a "unified" 2D view may refer to a 2D view of a simulated environment that includes multiple types of sensor data associated each region (e.g., pixel) of the 2D view. For instance, operation 106 may include generating a 2D view (e.g., box 108) that includes image data (e.g., light and color data), depth data, object identifiers, velocity data, material data, etc., for each pixel of the view. In some examples, the sensor engine may use initiate rasterization processes on a GPU to generate the visual image data and depth data, and may access and analyze simulated object data within the simulated environment to determine object identifiers, velocities, material data, reflectance, roughness, etc. For each discreet region within the unified 2D view (e.g., pixel or other predetermined region), the sensor engine may generate an array, data structure, or other storage configuration capable of storing the multi-sensor data for the region. In some examples, the unified 2D view may be stored as a multi-layer data structure, in which different attributes (e.g., physical properties) are stored in different layers of the structure.

At operation 110, the sensor engine may reproject the 2D view generated in operation 106, to spatially align the 2D view with a particular sensor. For example, the sensor engine may determine that, for a particular sensor within the simulation, the position and/or orientation angle of the sensor does not correspond to the focal point and/or orientation angle of the 2D view from which the sensor receives input data. Operation 110 may include initially determining whether or not a 2D view is aligned with its corresponding sensor, and reprojection might not be required in some examples if the sensor is aligned within a spatial and/or temporal threshold of the 2D view. However, because multiple sensors at different locations on the vehicle may be mapped to the same 2D view, in some cases the sensor engine may generate reprojections of the shared 2D view that are specific to at least one of the sensors mapped to the shared view.

In some examples, the sensor engine may use ray casting and/or ray tracing techniques to generate a reprojection of the 2D view for a particular sensor in operation 110. For instance, after rasterizing the 2D view and depth buffer in operation 106, the sensor engine may cast rays from the location of the sensor within the simulated environment toward the 2D view, which may intersect the 2D view at ray intersection points. After casting the rays, the sensor engine may apply ray marching to the depth data (e.g., depth buffer field) associated with the 2D view to determine the depth values at the ray intersection points. In some cases, the sensor engine may cast rays based on the different position of a sensor at two different times during the simulation, to determine ray intersection points within the depth data. The sensor engine may cast one or more secondary rays from the intersection point with the depth data to compute shadowing and masking information that can be used to simulate various visual effects within the simulation. Recursive ray casting also may be used in some implementations.

Reprojecting the view in operation 110 may include generating a point cloud and/or generating an image, based on the attributes/physical properties stored in the unified 2D view. For example, certain types of sensors (e.g., lidar, radar, etc.) may be configured to receive a point cloud representation 112 of the environment from the perspective of the sensor, whereas other types of sensors (e.g., cameras) may be configured to receive image data. Accordingly, the sensor engine in operation 110 may determine the time of simulated sensor for which the 2D view is being reprojected, and the reprojection may include generating a lidar point cloud based on the unified 2D view (e.g., for lidar sensors), a radar point cloud based on the unified 2D view (e.g., for radar sensors), a 2D image view (e.g., for camera sensors), etc. In some implementations, the reprojection in operation 110 may be skipped for certain sensor types. For instance, when the sensor is a camera the sensor engine might not generate an image reprojection but may use the rasterized image of the 2D view for the image sensor input data.

As noted above, ray tracing/ray casting may be used to reproject the 2D view in operation 106. For example, ray tracing may be used to generate a point cloud that spatially aligns the simulated sensor and the 2D view at a point in time during the simulation. In addition, during the execution of the driving simulation, the simulated sensor may move based on the vehicle movement and/or may move independently of the vehicle (e.g., a spinning camera, lidar, or radar sensor). The sensor engine may be configured to cast rays at periodic time intervals after the generation of the 2D view, based on the updated positions and/or orientations of the sensor at the time intervals. Using the rays cast at each time interval, the sensor engine may generate reprojections (e.g., point clouds and/or images) of the 2D view to re-align the 2D view to correspond to the updated sensor position and angle. To perform the ray casting, the sensor engine may determine the pose of the simulated vehicle at various time intervals, and may interpolate the pose from a previous time interval to a current vehicle pose. The sensor engine also may determine the updated states of the simulated vehicle sensors, including the movement (e.g., spinning) of any sensors between the previous time interval and the current state.

At operation 114, the sensor engine may perform spatial and/or temporal upsampling techniques on the generated 2D view and/or the generated reprojection of the view) to provide as sensor data for a simulated sensor. The upsampling techniques described herein may be used to enhance various aspects of the 2D view, including both visual image data and/or non-visual sensor data, by enhancing and/or increasing the rendering resolution of the 2D view. Various types of upsampling techniques and algorithms may be used, which may be performed by the GPU in various implementations. In contrast to certain conventional upsampling techniques, the sensor engine in operation 114 may determine whether or not to apply a blending and/or linear interpolation approach based on depth data, object identifiers, and/or object velocities within the simulation.

In some examples, the sensor engine may apply a depth-aware image spatial upsampling technique. Box 116 depicts an example of depth data 118 corresponding to the 2D view shown in box 108. In this example, different portions of the depth data may represent different objects within the point cloud and/or image representation of the environment. Different portions of the depth data may correspond to different objects represented in the reprojection. Objects in the background of the point cloud or image representation may be allotted fewer pixels, and may be rendered at a lower resolution than other objects in the foreground of the view. For spatial upsampling to improve the resolution of an object, the sensor engine may perform a depth-aware spatial upsampling technique. For instance, the sensor engine may cast rays into a bounding box for a low-resolution object, and may determine ray intersection points within the depth data. A set of adjacent depth values may be retrieved from the depth data and analyzed to determine whether the ray intersection points are on a relatively planar surface.

Additional upsampling techniques performed by the sensor engine may include temporal upsampling that is movement-aware, which is based on the movement of the simulated vehicle, sensors, and/or the other simulated objects depicted in the reprojection of the 2D view (e.g., point cloud or image). For example, the sensor engine may cast rays 120 and 122 from a sensor location at two different times during the simulation. At a first time (e.g., t1) and second time (e.g., t2) in the simulation, the sensor engine may cast rays from the position of the sensor and at the orientation of the sensor. Between times t1 and t2, the simulated vehicle may change position and orientation as it traverses the simulated environment, and/or a sensor may move (e.g., rotate) relative to the vehicle. Other dynamic objects in the simulation can also move between times t1 and t2 in the simulated environment. In these examples, the sensor engine may analyze the depth, object identifiers, and/or velocities associated with the ray intersection points, to determine whether to perform linear interpolation or a different upsampling technique.

At operation 124, the sensor engine provides sensor data as input to the simulated sensor(s) executing within a simulation system (e.g., simulated vehicle sensors within a driving simulation). The reprojection(s) generated in operation 110, of the 2D view(s) generated in operation 106, may be used as the sensor data provided to the simulated vehicles sensors. In various examples, reprojection(s) may or may not include modifications based on the spatial and/or temporal upsampling techniques performed in operation 114.

As illustrated by FIG. 1 and the various examples, the techniques described herein provide improvements and technical advantages for generating sensor data, rendering views of simulated environments, and executing driving simulations as well as other types of simulations. For example, generating and using multi-sensor unified 2D views, including GPU-based rasterization followed by reprojection and/or upsampling, provides more efficient real-time simulation performance that increases speed and reduces GPU latency for rendering of views. These techniques may be used to effectively decouple sensors from views, thus requiring fewer views overall to be generated during a simulation, while also providing higher-quality sensor input data with improved spatial and/or temporal alignment and/or upsampling. Additionally, the techniques described herein support dynamic reconfiguration of GPU rendering rates and/or view resolutions, to comply with simulation requirements for resolution, jitter, etc., depending on the GPU capacity and latency observed during the simulation. By managing the GPU resources more efficiently for rendering and updating views, these techniques also provide advantages in executing real-time simulations that include additional numbers of sensors and/or sensors with higher resolutions or firing rates.

Figure 2:
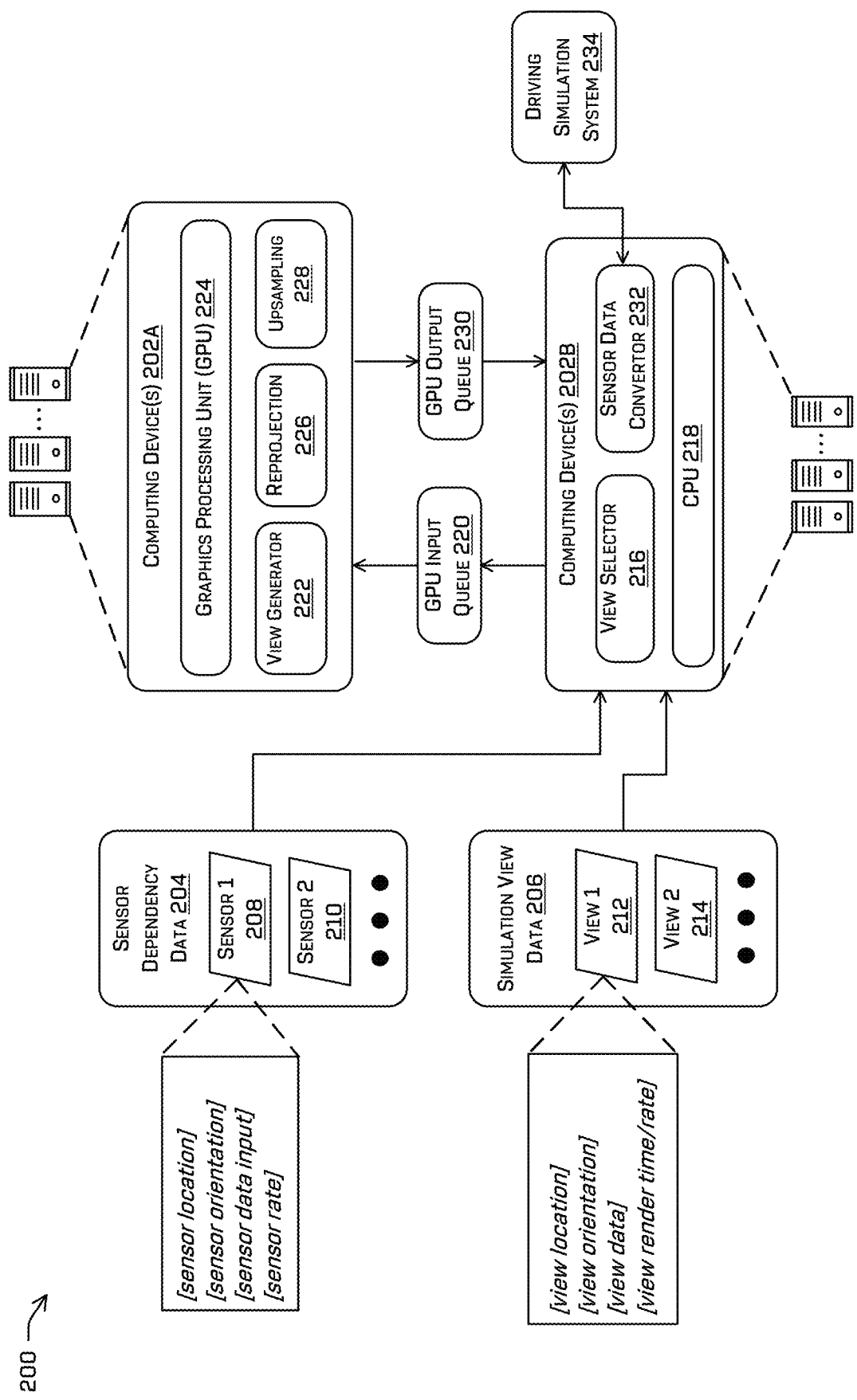
FIG. 2 illustrates an example system of generating and using views of a simulated environment to provide data to simulated sensors, in accordance with one or more implementations of the disclosure.

FIG. 2 depicts an example system 200 including one or more computing device(s) 202 and components configured to generate 2D views of simulated environments, and generate sensor input data based on the 2D views to provide to simulated sensors operating within a simulation. In this example, computing devices 202A and 202B (which may be referred individually or collectively as computing device(s) 202) may be implemented as a sensor engine, including components configured to monitor a simulation executing on a driving simulator other simulation system, and to generate sensor data to be provided as input data to simulated sensors. In various examples, computing device(s) 202 receive sensor dependency data 204 and simulation view data 206 relating to a simulation currently executing on one or more simulation systems (e.g., driving simulation system 234). As shown in this example, sensor dependency data 204 may be different for the different sensors (e.g., sensors 208 and sensors 210) within the simulation, and may include data such as (but not limited to) the location of the sensor within the simulated environment, the orientation of the sensor, the field of view of the sensor, the types of data that the sensor is configured to detect, and the sensor execution times/rates. Certain sensor data (e.g., sensor location, orientation, current operating status and/or characteristics) may change during the course of a simulation, and thus the sensor dependency data 204 for such sensors also may change during the simulation.

The computing device(s) 202 also may receive simulation view data 206 associated with multiple different 2D views (e.g., View 1 indicated by reference 212 and View 2 indicated by reference 214) currently rendered within the simulation. The simulation view data 206 may include (but is not limited to), the location (e.g., focal point) of the view, the orientation (e.g., angle) of the view, the types of data stored for the discreet regions (e.g., pixels) of the view, the rendering times/rates associated with the view, the resolution, and/or bounds of the view.

Along with the sensor dependency data 204 and simulation view data 206, the computing device(s) 202 may be configured to store and/or retrieve GPU operational data, such as rendering/processing capacity and latency, which may be used to determine and optimize the view rendering rates during the simulation. The computing device(s) 202 also may monitor one or more simulations executed by the driving simulation system 234, including determining the characteristics of the simulated environments and the static and dynamic objects within the simulations. As described in various examples herein, the numbers, types, positions, velocities, and other properties of the agents and objects in the simulation may be used by various components of the computing device(s) 202 to determine and scheduling the rendering of views at different times, to update and align views with sensors, and to perform spatial and/or temporal upsampling to improve the quality of the sensor data provided based on the views.

Within the computing device(s) 202, which also may be referred to as a sensor engine or sensor simulation system, a view selector component 216 may be configured to determine which to 2D views of the simulated environment are to be rendered at different times during the simulation. As shown in this example, the view selector component 216 may be executed on a CPU 218 within the computing device(s) 202. As described above in reference to operation 102, the view selector component 216 may receive and analyze the sensor dependency data 204, simulation view data 206, and/or various additional simulation-related data (e.g., GPU capacity and latency data, simulated vehicle state, simulation agent/object state, etc.). Using these data, the view selector component 216 may apply heuristics-based algorithms and/or machine-learning models to determine which view(s) are to be rendered at various different times during the simulation.

After determining a 2D view to be rendered for a particular time during a simulation, the view selector component 216 may provide data identifying the view to be rendered (and/or requested view rendering output time) to the GPU input queue 220. In some examples, when providing the requested view to the GPU input queue 220, the computing device(s) 202 also may place one or more threads/processes related to the view into an inactive state (e.g., sleeping), to be awoken upon receiving an indication that the requested view has been rendered by the GPU 224. For instance, the computing device(s) 202 may implement one or more GPU/GPU fences and/or GPU/CPU fences to control the flow of rendered views through the processing pipeline described herein.

When a requested view is place into the GPU input queue 220, the view generator component 222 may retrieve data associated with the view to be generated, such as the simulation view data 206 for view to be rendered, the current location of the simulated vehicle (and/or sensors), and the current states of the simulated environment and other simulated agents/objects within the environment. The view generator component 222 may provide the data to the GPU 224, which may be configured to render the requested view. In some examples, the GPU 224 may perform one or more rasterization processes to render the requested 2D view, including a 2D image data view, a 2D depth view, and one or more other 2D views which may be combined as layers into unified 2D view that includes visual data, depth data, and/or various additional data (e.g., object identifiers, velocities, material properties, etc.) for each pixel or other region of the 2D view.

After generating a 2D view of the 3D simulated environment, the reprojection component 226 may be configured to use the GPU 224 to generate a reprojection (e.g., a modified 2D view) that is spatially and/or temporally aligned with a particular simulated sensor operating in the simulation. In some instances, the reprojection component 226 may perform some or all of the operations described above in reference to operation 110. For example, the reprojection component 226 may use ray casting and/or ray tracing to generate a reprojection of the rendered 2D view, by casting rays from the location of the sensor within the simulated environment toward the 2D view to determine ray intersection points. The visual and/or depth data associated with the ray intersection points may be used to align the 2D view, compute shadowing and masking information, and simulate various visual effects. Additionally, depending on the type of simulated sensor for which the reprojection is generated, the reprojection component 226 may generate a point cloud and/or a visual representation of the 2D view. For instance, for lidar or radar simulated sensors configured to receive point clouds as sensor input data, the reprojection component 226 may generate a point cloud. For cameras and other simulated sensors configured to receive light and/or visual input data, the reprojection component 226 may generate a 2D image view representation.

The upsampling component 228 may be configured to perform spatial and/or temporal upsampling techniques, using the GPU 224, on the reprojected representation of the 2D view generated by the reprojection component 226. Because the upsampling techniques may be performed on a reprojected representation of the unified 2D view, the upsampling component 228 may be configured to perform the spatial and/or temporal upsampling techniques described herein on both images and/or point cloud representations. As described below in more detail, spatial upsampling may enhance and/or increase the resolution of the sensor data provided to the simulated sensors based on the 2D view. For example, as described below, spatial upsampling techniques may determine sensor data values associated with ray intersection points that are in between the regions/pixels of the view reprojection. Spatially intermediate sensor data values (e.g., sensor data values corresponding to locations between pixels in the unified 2D view) may be determined using interpolation based on the sensor data values of the surrounding pixels, and/or based on sampling from one of the nearby pixels when determining that the sampling provides a more accurate representation of the sensor data at the intermediate location.

In contrast, temporal upsampling may be used to generate sensor data that more accurately represents the simulated environment at times in the simulation before or after the discreet times when views are rendered and/or reprojected. For instance, during a simulation the sensor engine may generate a first rendering of a view at a first simulation time and a second updated rendering of the view at a second simulation time. Both rendered views may be reprojected for a particular simulated sensor, at the first and second simulation time respectively. However, the simulated sensor may execute (or fire), during which it receives and processes the sensor input data, at a higher frequency (or higher rate) than the first and second simulation time, or might not execute in sync with the generation and reprojection of the views. In such examples, the upsampling component 228 may perform temporal upsampling to determine sensor data to provide to the simulated sensor at a time in between the first and second simulation times. As described below in more detail, in some cases the upsampling component 228 may interpolate based on the view reprojections at the first and second simulation times, to determine sensor data for intermediate simulation times between the first and second simulation times. In other cases, the upsampling component 228 may sample from either the view reprojection at the first simulation time or the view reprojection at the second simulation time, when determining that the sampling provides a more accurate representation of the sensor data at the intermediate time.

In some instances, the upsampling component 228 may perform some or all of the operations described above in reference to operation 114. For example, the upsampling component 228 may perform spatial and/or temporal upsampling that is depth-aware and/or uses additional data from the unified 2D view such as object identifiers, velocity data, material data, etc., to determine the particular upsampling technique to be applied to the 2D view. For example, using ray casting on low-resolution objects and/or moving objects, the upsampling component 228 may apply a linear interpolation for ray intersection points on a relatively planar surface, or on the same object as adjacent regions in the 2D view. In contrast, other techniques (e.g., sampling) may be applied for ray intersection points that are not on a relatively planar surface and/or not on the same object as their adjacent regions.

After using the GPU 224 to generate a rendered view, generate a sensor-specific reprojection of the view, and/or perform upsampling on the reprojected view, the computing device(s) 202 may provide the output view to the GPU output queue 230. When a rendered view is placed into the GPU output queue 230, the computing device(s) 202 may initiate one or more post-processing components to retrieve and provide the rendered view data for use as input data to a simulated sensor. For example, the sensor data convertor component 232 may be configured to retrieve the images and/or point cloud representations from the GPU output queue 230, convert the image/point representations into a messaging format associated with the simulated sensor, and transmit the data to driving simulation system 234. When the sensor data is received by the driving simulation system 234, it may be provided as sensor input to one or more sensors of the simulated autonomous vehicle executing within the driving simulation. In some examples, the sensor engine may use separate threads to push view/sensor data generation tasks onto the GPU input queue 220, and additional separate threads to pull sensor data (e.g., images, point clouds, etc.) from the GPU output queue 230.

As shown in this example, the computing device(s) 202 may be implemented as separate computing devices 202A and 202B operating within separate computing environments and/or on separate networks. In other examples, the computing device(s) 202 may be integrated into a single computing device or server associated with a simulation system. In some implementations, the usage of the CPU 218 and GPU 224 may be coordinated and managed so that the GPU 224 is configured to perform rasterization to generate the rendered views, ray tracing/ray casting to align the rendered 2D view, spatial and/or temporal upsampling, etc., to generate the sensor data that is provided to the simulated sensors. The CPU 218 may be configured to perform separate pre- and post-processing functionalities, such as view selection and scheduling, retrieval of sensor data from GPU output queues, message formatting and packing, and delivery of the sensor data to the simulated sensors. In these implementations, the computing devices 202 may monitor the speed, performance, capacity, and latencies associated with the respective tasks performed by the GPU 224 and CPU 218, in order to more efficiently manage the execution real-time simulations. For example, the computing device(s) 202 may dynamically increase or decrease the rendering rates for generating updated 2D views, and/or may increase or decrease the quality and amount of ray-tracing alignment and upsampling, based on the current capacity, latency, and performance of the based on the latency of the GPU 224, etc.

Figure 3:
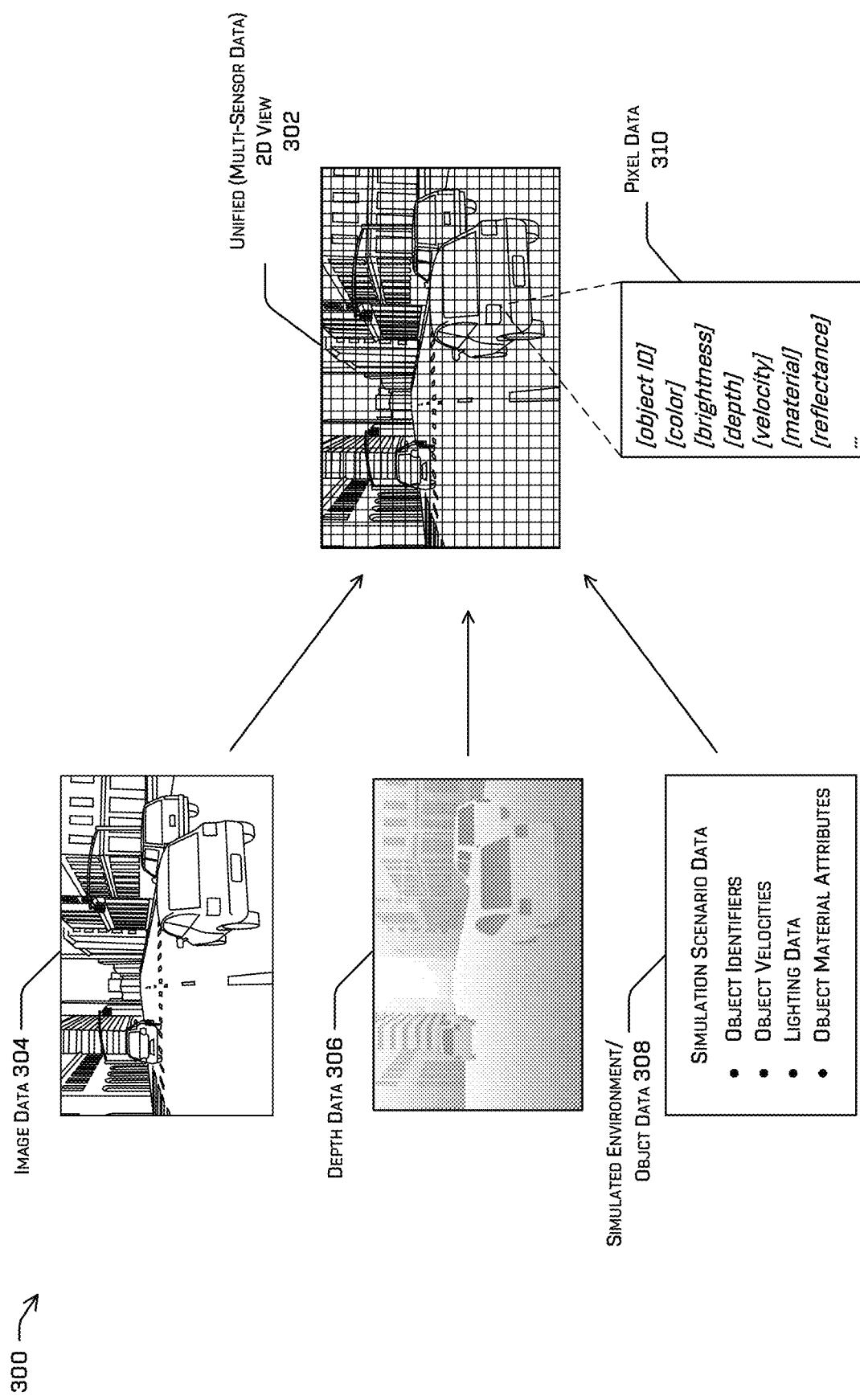
FIG. 3 illustrates an example of a unified multi-sensor view of a simulated environment, in accordance with one or more implementations of the disclosure.

FIG. 3 illustrates an example technique 300 for generating a unified, multi-sensor data 2D view 302 of a simulated environment. In some instances, the technique depicted in this example may be performed by a GPU 224, alone or in combination with additional components executed by the GPU 224 and/or CPU 218 of computing device(s) 202. For instance, the GPU 224 may generate a first 2D view including visual image data 304, and a second 2D view including depth data 306. The image data 304 and depth data 306 may be generated by rasterizing the 3D simulated environment, based on a selected location (e.g., a current position of the simulated vehicle) within the simulation and a selected orientation. In this example the 2D views for the image data 304 and depth data 306 may correspond to a forward-facing view from the perspective of the simulated vehicle traversing the simulated environment.

The computing device(s) 202 also may retrieve additional simulated environment/object data 308, corresponding to the same regions of the simulation depicted in the 2D views for the image data 304 and depth data 306. For example, the computing device(s) 202 may monitor the simulation and/or retrieve simulation data including the corresponding object identifiers, velocities, and material properties for any objects depicted within the rasterized 2D views for the image data 304 and depth data 306. The computing device(s) 202 also may retrieve simulation lighting data and/or other properties of the simulated environment.

The 2D views containing the visual image data 304 and depth data 306 may be combined in an array or other storage configuration with the simulated environment/object data 308, to construct the unified 2D view 302. As shown in this example, the unified 2D view 302 may include data within multiple layers for each pixel (or other discreet region within the 2D view), in which the pixel data 310 includes an object identifier, color, brightness, depth, velocity, material, reflectance, and/or other physical properties associated with the particular pixel.

Although not depicted in this example, the computing device(s) 202 may include one or more additional components used to generate and/or modify the unified 2D views described herein. For example, computing device(s) 202 may include a shadow identification component configured to execute a machine learning algorithm trained to detect one or more shadows in image data 304. In some cases, the shadow identification component can receive geometric information of the simulated environment, and a location of a light source as input to the algorithm to detect one or more shadows in image data.

The computing device(s) 202 also may include a region identification component configured to identify corresponding regions in a set of images, for instance, map regions based on features in image data. In some instances, the region identification component may identify regions based on image data 304 being projected onto a 3D mesh of an environment. In some examples, the computing device(s) 202 may include a blending component configured to combine regions of image data 304 from a plurality of images to generate an updated region of image data with a contribution of a shadow minimized or omitted. The computing device(s) 202 also may include a duplicating component configured to identify a source of the image data 304 to be used to replace image data at a particular region or location. For example, a destination region can correspond to a shadow region of an image, while a source region can correspond to image data that is illuminated (e.g., does not include a shadow) from a corresponding region in another image. In some examples, a source region can be based on image data having similar color values, semantic information, LIDAR intensity, etc.

In some examples, the computing device(s) 202 may include a 3D mapping component configured to map or project image data onto portions of a 3D mesh. That is, the 3D mapping component can project image data captured by an image sensor onto a 3D mesh of the environment that corresponds to the environment represented in the image data. In such examples, a 3D mesh component may receive log files (or sensor data, generally) from the simulated vehicles, and can generate or update a map of an environment. The 3D mesh component in some instances can generate a 3D mesh (or other representation, e.g., Signed Distance Function, voxel, voxel hash, etc.) of an environment based on sensor data captured by one or more LIDAR sensors (or other sensors), for example (e.g., depth data 306). Surfaces in a 3D map can be represented by one or more polygons. In some instances, objects can be represented by voxels, histograms, or distribution functions. In some instances, surfaces in a 3D map can be represented by a parameterized entity (e.g., NURBS). In some instances, the 3D mesh component can associate semantic information with individual polygons of the 3D mesh.

The computing device(s) 202 also may include a light source component including functionality to determine a source of light associated with the image data 304. In some instances, the light source component can receive a location of the environment represented in image data (e.g., latitude, longitude, elevation, etc.), time of day, day of the year, and the like to determine where a light source is when capturing an image. In another example, the light source component can be used to determine a location of a light source with respect to a 3D mesh needed to illuminate a portion of the 3D mesh (e.g., to search for image data of a surface not occluded by shadows). A light scene evaluation component may include functionality to determine, with respect to image data representing an environment, a type of light present in the scene. In some instances, the light scene evaluation component can include a machine learning algorithm trained to detect scenes of diffuse light, such as cloudy days. In some instances, the light scene evaluation component can access weather data associated with a location to determine weather conditions present at a time of capturing one or more images. In some instances, the light scene evaluation component can generate a score associated with an image or with individual regions of an image indicating a diffuse quality of lighting present in the region or image.

The computing device(s) also may include a reflectance component including functionality to determine a reflectance of a surface with respect a surface angle. In some instances, the reflectance component can determine LIDAR intensity data with respect to an angle of incidence of the LIDAR beam for a point on a surface. In some instances, the reflectance component can determine a bidirectional reflectance distribution function (BRDF) for one or more points or surfaces in an environment (and/or a bidirectional scattering-surface reflectance distribution function (BSSRDF)). In some examples, individual points and/or surfaces within an environment can be classified as Lambertian surfaces (e.g., matte, diffuse, etc.), specular surfaces (e.g., glossy), mirrored surfaces, and the like. In some instances, the reflectance characteristics can include a bidirectional reflectance distribution function (BRDF). In some instances, the reflectance component can generate a BRDF channel for each polygon of a 3D mesh and/or for each pixel of an image associated with the 3D mesh. In some examples, the driving simulation system 234 may include functionality to receive a 3D map with shadows omitted and to project a light source onto the 3D map from an arbitrary location to generate artificial shadows based on the 3D geometry of the environment. In some instances, when a 3D map includes BRDF information for various surfaces, the driving simulation system 234 can represent reflections of light based on the reflectance of various surfaces. In some instances, the driving simulation system 234 can simulate photorealistic images of an environment from a textured 3D map with shadows removed.

Examples of these and other various components that may be incorporated into the computing device(s) 202 to assist in the generation and modification of the unified 2D view 302 can be found, for example, in U.S. Pat. No. 10,699,477 titled "Generating Maps Without Shadows," issued Jun. 30, 2020, which is each incorporated herein by reference in its entirety for all purposes.

Figure 4A:
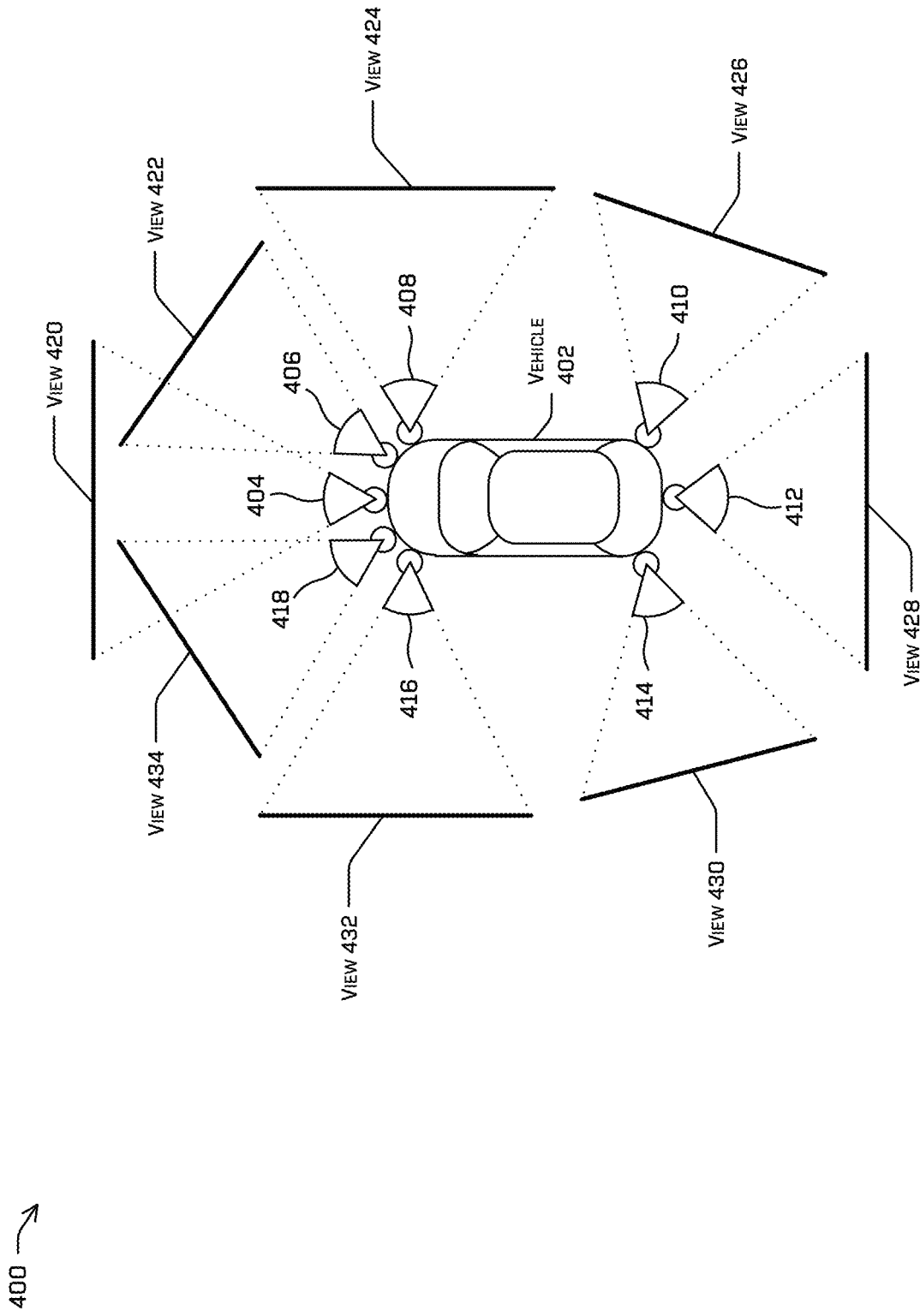
FIGS. 4A-4C illustrate examples of simulated environments including a simulated vehicle with simulated sensors associated with one or more rendered views, in accordance with one or more implementations of the disclosure.
Figure 4B:
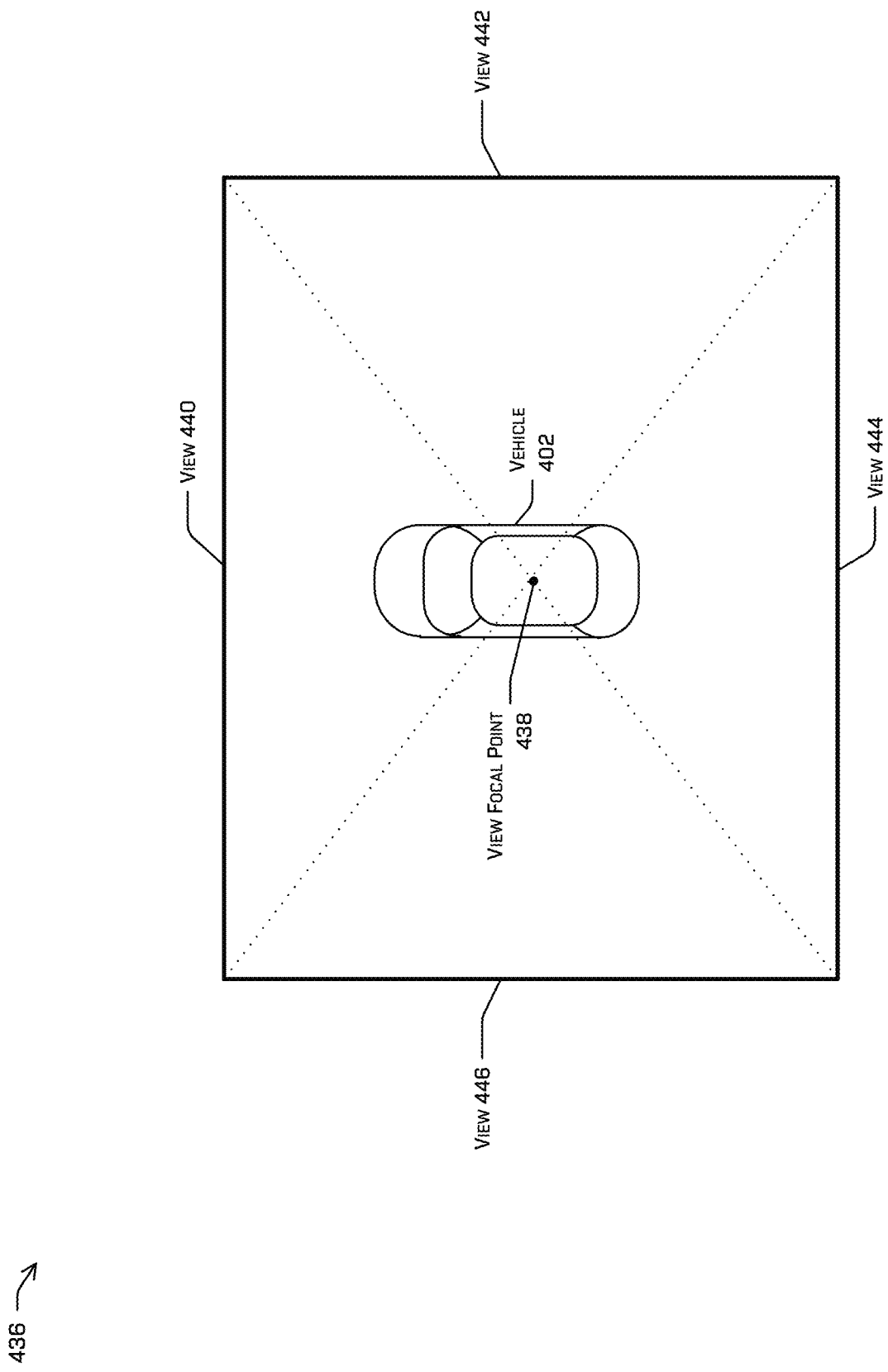
Figure 4C:
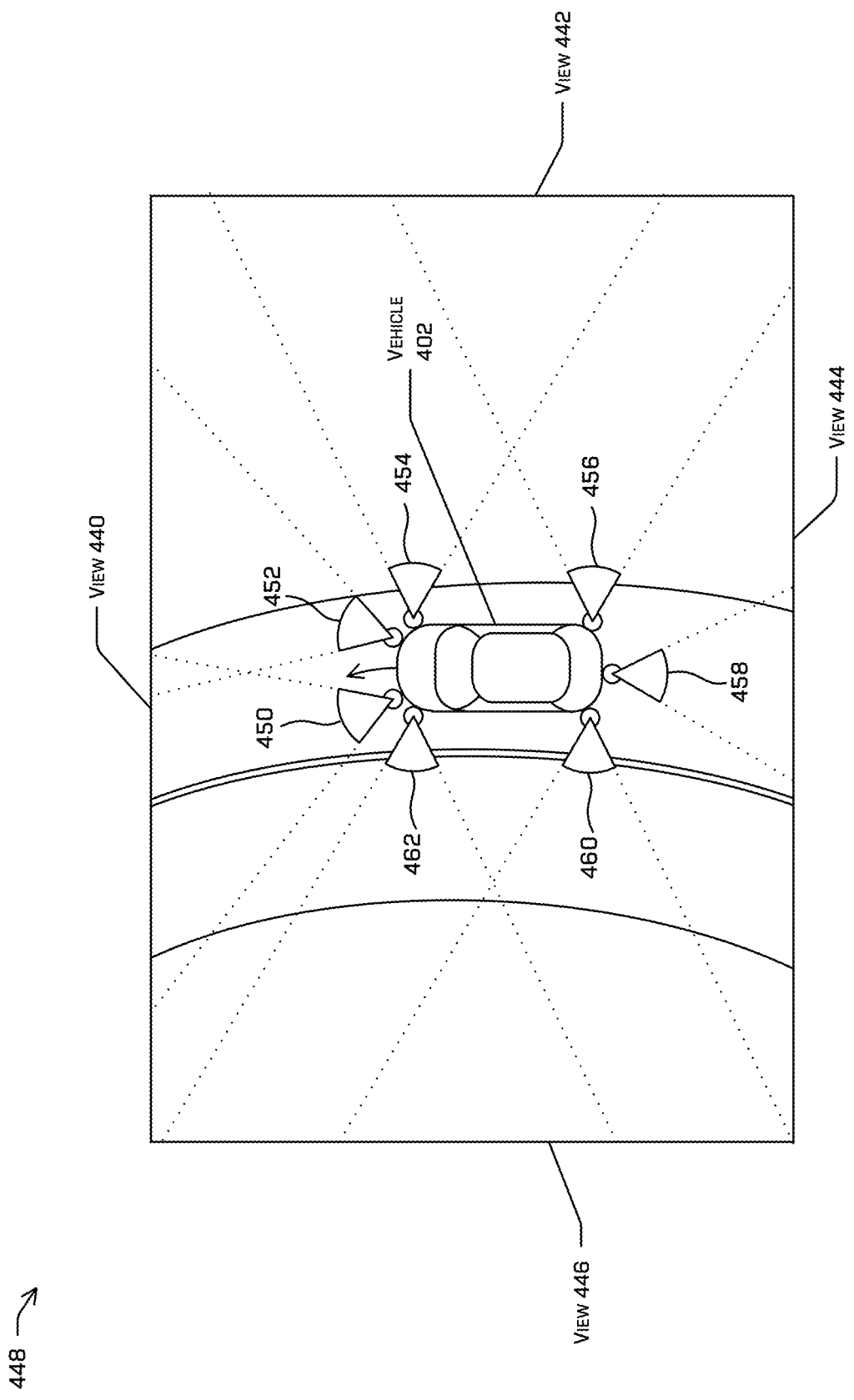

FIGS. 4A-4C show examples of three simulated environments, each including a simulated vehicle and a number of views rendered to provide sensor data for simulated sensors associated with the simulated vehicle. These examples illustrate various configurations of simulated sensors on the simulated vehicle, as well as various configurations of 2D views rendered to provide sensor data for the simulated sensors. As discussed in more detail below, FIG. 4A shows an example in which a different 2D view is generated for each simulated sensor of the vehicle. FIG. 4B shows an example in which four different 2D views are generated around the simulated vehicle, to provide 360 degrees of sensor data for any or all of the simulated sensors of the vehicle, and FIG. 4C shows an example mapping of a configuration of simulated sensors on the vehicle to the four different 2D views.

FIG. 4A shows an example simulated environment 400, including a simulated vehicle 402 traversing the environment during a driving simulation. In this example, the simulated vehicle 402 includes a number of sensors 404-418 installed on the exterior surface of the simulated vehicle 402, which are configured to detect and process sensor data from the simulated environment 400. For each of the sensors 404-418, FIG. 4A depicts the sensor orientation and field of view of the sensor, with respect to its position on the simulated vehicle 402. FIG. 4A provides an example in which the sensors 404-418 of the simulated vehicles are mapped one-to-one with the 2D views 420-434 that have been rendered based on the 3D simulated environment. That is, in this example, each simulated sensor 404-418 is associated with a unique 2D view that is generated and used to provide the input data to that sensor. Sensor 404 receives input data based on view 420, sensor 406 receives input data based on view 422, and so on. As discussed above, simulated sensors 404-418 may include various different types of sensors (e.g., cameras, radar, lidar, etc.), and each of the respective views 420-434 may be generated as point cloud and/or image including the appropriate type and amount of data for the associated sensor.

FIG. 4B shows another example simulated environment 436, in which the sensor engine determines a view focal point 438 associated with the simulated vehicle 402, and generates four separate views 440-446 based on the view focal point 438. The four separate views 440-446 are arranged at right angles to one another in this example, and provide 360-degree coverage with respect to the simulated vehicle 402. In other examples, a greater or lesser number of views may be rendered, from which to provide input data to the simulated sensors on the simulated vehicle 402. In some cases, if none of the vehicle sensors is oriented in a particular direction for a period of time during the simulation, then the sensor engine need not render a view covering that direction during that period of time.

Each view 440-446 may be mapped to (e.g., may provide sensor for) zero, one, or multiple different simulated sensors, depending on the numbers, types, positions, and orientations of the simulated sensors on the simulated vehicle 402. Accordingly, each view 440-446 may be generated as a unified 2D view including different types of data (e.g., image data, depth data, etc.) that can be used to serve different sensor types. In some cases, certain of the views 440-446 may be generated to include only specific types of sensor data and not other types of sensor type, based on the data requirements of the sensors mapped to that view during a period of time in the simulation. As an example, if the only sensor facing view 442 at a period of time during the simulation is an image sensor (e.g., camera), then the sensor engine may generate view 442 to include only image data and not additional types of sensor data that may be included in other unified 2D views (e.g., lidar data, radar data, etc.).

FIG. 4C shows another example simulated environment 448 in which a number of sensors are depicted on the simulated vehicle 402, and in which each sensor is mapped to one or more of the views 440-446 discussed above in reference to FIG. 4B. In this example, the simulated vehicle 402 is shown traversing the environment during a driving simulation. The simulated vehicle 402 includes a different configuration of sensors 450-462 position on the exterior of the simulated vehicle 402, and for each of the sensors 450-462 FIG. 4C depicts the orientation and field of view of the sensor with respect to its position on the simulated vehicle 402. As noted above, in some examples the simulated sensors may be decoupled from the views, and vice versa. FIG. 4C provides an example of a decoupling of the sensors 450-462 from the 2D views 440-446 rendered in the simulated environment 448. That is, in this example there is not a one-to-one relationship between each of the sensors 450-462 and the 2D views 440-446 used to provide input data to the sensors. Sensors 450 and 452 receive input data from view 440, sensors 454 and 456 receive input data from view 442, sensor 458 receives data from view 444, and sensors 460 and 462 receive data from view 446. Accordingly, because views are shared by multiple sensors in this example, fewer views overall may be required by the simulation.

In some cases, a single simulated sensor might receive sensor data based on multiple different views. For example, simulated sensor 456 is depicted having a field of view that includes both view 442 and view 444. In this example, the sensor engine may generate the sensor data for simulate sensor 456 by rendering, reprojecting, and/or upsampling the separate views 442 and 444, and then combining the relevant portions of views 442 and 444 and providing the combined sensor data to sensor 456. In other examples, the sensor engine may respond dynamically to instances of sensors mapping to multiple views by re-orientating and re-rendering one or more views so that each sensor 450-462 maps to a single view.

The simulated environment 448 shows the simulated vehicle 402 at a single point in time during a driving simulation. As the simulation progresses, it can be understood that the positions and/or orientations of the simulated vehicle 402 and/or the sensors 450-462 may change relative to the views 440-446. For instance, the simulated vehicle 402 may move and/or turn within the simulated environment 448, and each of the sensors 450-462 may exhibit a corresponding change in position and orientation. Additionally, certain of the sensors 450-462 may be configured to rotate with respect to the simulated vehicle 402.

Figure 5:
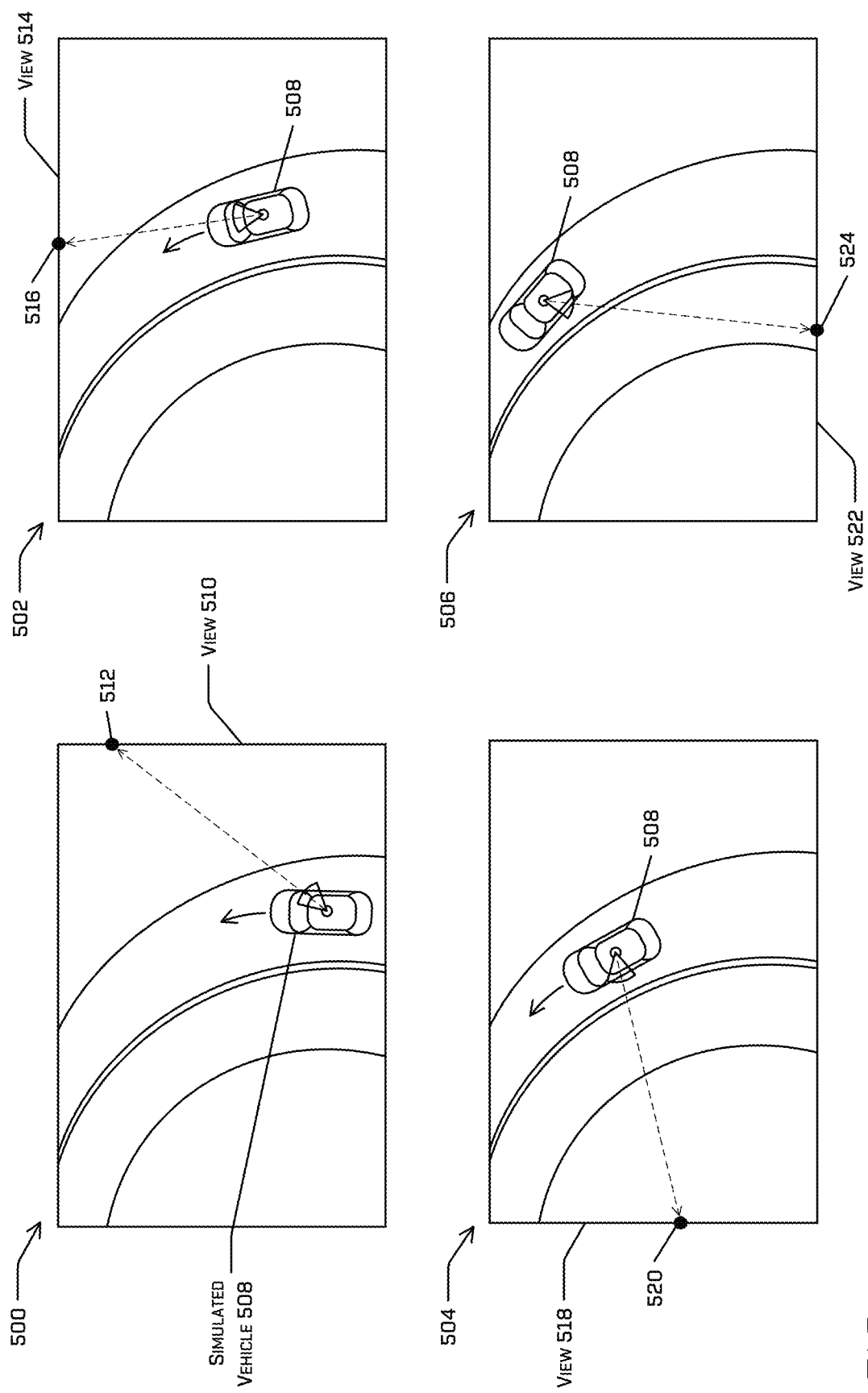
FIG. 5 illustrates another example simulated environment including a moving simulated vehicle with a rotating sensor, and rendered views, in accordance with one or more implementations of the disclosure.

FIG. 5 depicts another example driving simulation, including four different simulated environments 500-506 corresponding to four different points in time during the simulation. In this example, a simulated vehicle 508 is depicted traversing forward along a curved road. The simulated vehicle 508 includes a single simulated sensor, which may be a spinning lidar sensor (and/or any other sensor configured to change orientation independently of the vehicle). As shown in this example, in the simulated environment 500 (e.g., time t1), the sensor is oriented to view 510 and emits light that intersects the view 510 at point 512. As the vehicle traverses the environment, the vehicle orientation and the sensor orientation changes. In simulated environment 502 (e.g., time t2), the sensor is oriented to view 514 and emits light that intersects the view 514 at point 516. In simulated environment 504 (e.g., time t3), the sensor is oriented to view 518 and emits light that intersects the view 518 at point 520. In simulated environment 506 (e.g., time t4), the sensor is oriented to view 522 and emits light that intersects the view 522 at point 524.

As this example illustrates, during a simulation the positions and/or orientations of simulated vehicles and/or sensors may change relative to the views rendered for the simulation. In response to changes in sensor position and/or orientation, the sensor engine may generate reprojections based on some views, may regenerate certain views, may reorient the views, and/or may determine updated mappings between sensors and views.

Figure 6A:
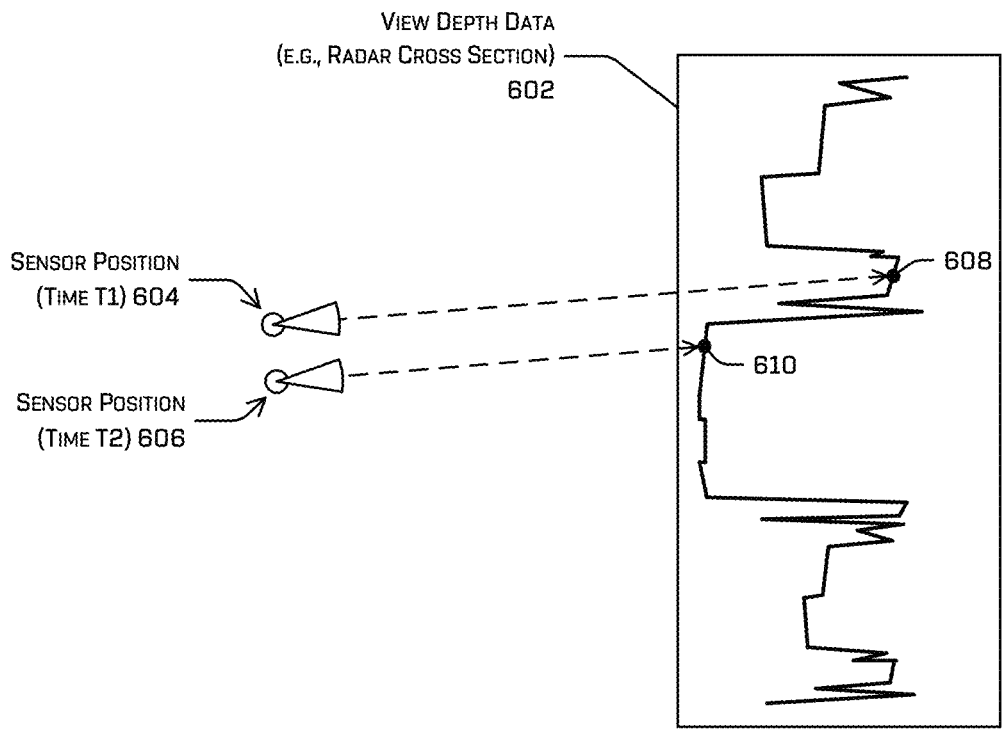
FIGS. 6A and 6B illustrate examples of a depth-based ray casting technique in a simulated environment, in accordance with one or more implementations of the disclosure.
Figure 6B:
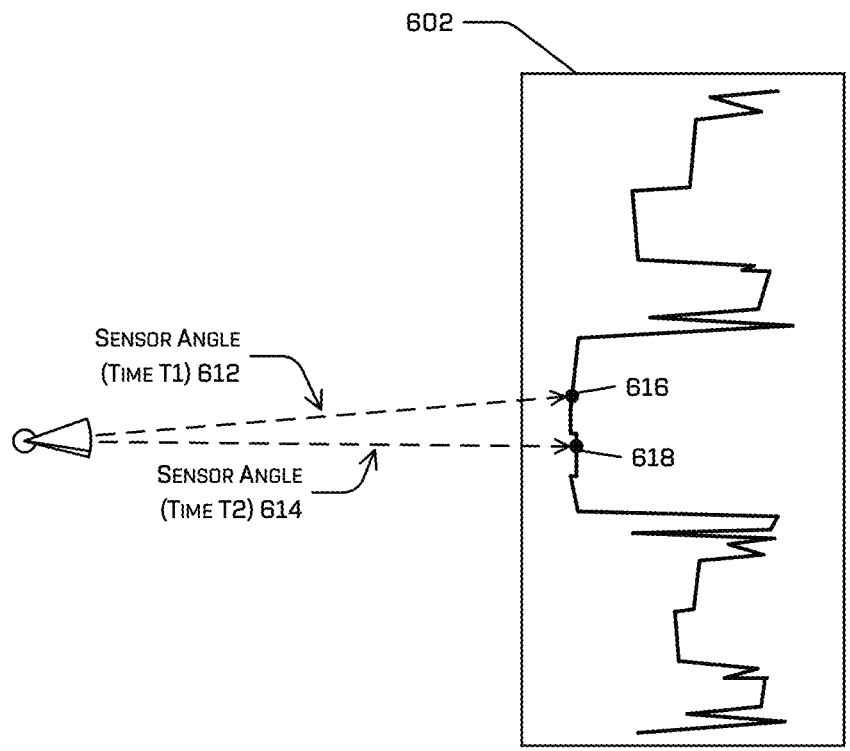

FIGS. 6A and 6B illustrate two examples of a depth-aware ray casting technique in a simulated environment. In various examples, the techniques described in FIGS. 6A and 6B including ray casting in simulation scenarios in which a simulated sensor has moved during the course of the simulation, casting a first ray at a first simulation time and a second ray at a second simulation time. In both FIGS. 6A and 6B, multiple rays are cast by a sensor at different times into the depth data 602 associated with the unified 2D view to which the simulated sensor is mapped. The techniques described herein may be applied to temporally align and/or upsample a generated view with respect to a specific sensor, as described above in reference to operation 110 in FIG. 1 and in reference to the reprojection component 226 in FIG. 2. Additionally or alternatively, the techniques described herein may be applied to spatial and/or temporal upsampling, as described above in reference to operation 114 in FIG. 1 and in reference to the upsampling component 228 in FIG. 2.

FIG. 6A depicts a scenario in which the position of the sensor has moved from position 604 at time t1 to position 606 at time t2. The movement of the sensor in FIG. 6A may correspond to the movement of the vehicle traversing the simulated environment. In this example, the ray cast from the sensor at position 604 intersects the depth data 602 (which may be a rasterized depth view corresponding to the unified 2D view) at ray intersection point 608, and the ray cast from the sensor at position 606 intersects the depth data at ray intersection point 610. The ray intersection points 608 and 610 in this example have a relatively large difference in depth values, indicating a non-planar surface (and/or different simulated object) between the ray intersection points 608 and 610. Based on the depth difference between the ray intersection points 608 and 610 in this example, the sensor engine may determine that a sampling technique rather than a linear interpolation technique is to be used for alignment and/or upsampling. For instance, to determine the sensor data to be used for a time in the simulation between times t1 and t2, rather than using linear interpolation based on points 608 and 610, the sensor engine may select the sample of either point 608 or 610, based on whether the time in the simulation is closer to time t1 or time t2.

FIG. 6B depicts another scenario in which the position of the simulated sensor has not moved, but the orientation of the sensor has moved from sensor angle 612 at time t1 to sensor angle 614 at time t2. The movement of the sensor in FIG. 6B may correspond to the turning of the vehicle in the simulated environment and/or the rotation of a sensor relative to the vehicle. In this example, the ray cast from the sensor along sensor angle 612 intersects the depth data 602 at ray intersection point 616, and the ray cast from sensor angle 614 intersects the depth data at ray intersection point 618. Unlike ray intersection points 608 and 610, in this example the ray intersection points 616 and 618 have a small difference in depth values, indicating a relatively planar surface (and/or a higher likelihood of the same simulated object) between the ray intersection points 616 and 616. Based on the smaller depth difference between the ray intersection points 616 and 618, the sensor engine in this example may determine that a linear interpolation technique and not a sampling technique is to be used for alignment and/or upsampling. For instance, to determine the sensor data to be used for a time in the simulation between times t1 and t2, the sensor engine may use linear interpolation based on sensor data values corresponding to the points 616 and 618, effectively blending the color, velocity, brightness, material, etc.

Although depth data 602 is used in this example, in other examples similar techniques may be performed by casting rays into 2D views at different points in time during a simulation, and then determining a preferred alignment and/or upsampling technique based on whether the object IDs at the ray intersection points match, or whether the velocity values at the ray intersection points are within a predetermined threshold, etc.

Figure 7:
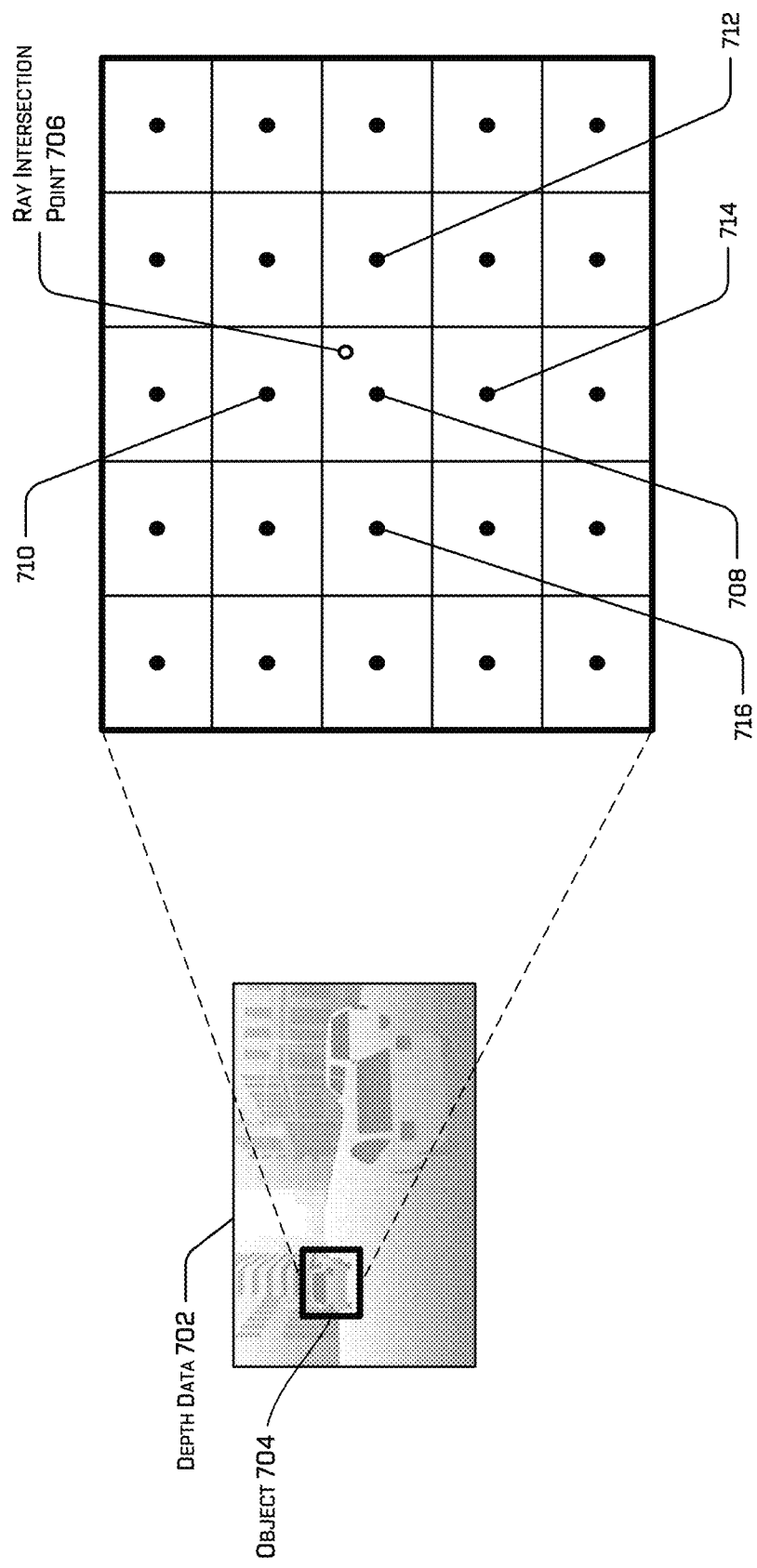
FIG. 7 illustrates an example depth-aware spatial upsampling technique for a sensor in a simulated environment, in accordance with one or more implementations of the disclosure.

FIG. 7 illustrates an example depth-aware spatial upsampling technique for a simulated sensor in a simulated environment. As noted above, in some examples, the sensor engine may perform spatial upsampling techniques, during or after generating the reprojection of the view, to enhance view quality and/or resolution of the sensor data to be provided to the simulated sensor. In this example, the spatial upsampling may be used to improve the quality and resolution of both visual and/or non-visual data (e.g., images and point clouds), by selecting an upsampling technique (e.g., linear interpolation or sampling) based on the depth data associated with a ray intersection point. As noted above, although this example describes a depth-aware upsampling technique using depth data, in other examples similar or identical techniques may use object identifier data and/or velocity data instead of or in conjunction with depth data.

In this example, an image 700 includes depth data 702 of a rendered 2D view of a simulated environment. Bounding box 704 identifies a low-resolution object in the background of the image of the depth data 702. Because the object in bounding box 704 is in background of the image, it may have fewer pixels allotted to it, and may be rendered at a relatively lower resolution for both the visible and non-visible data of the unified 2D view. The spatial upsampling technique described herein includes casting one or more rays into the bounding box 704 associated with the object, and determining sensor data values for the ray intersection points to improve the resolution of the 2D view at the region of the object. In this example, a ray is cast into the depth data 702 of the 2D view, which intersects the 2D view at ray intersection point 706. The regions including sample points 708-716 represent the adjacent pixels (or other discreet regions) of the 2D view, and each of the adjacent regions may include a set of unified multi-sensor data associated with the particular region (e.g., object identifier, color, brightness, depth, velocity, material, etc.).

Various algorithms may be used to evaluate the regions adjacent to the ray intersection point 706, to determine whether the ray intersection point 706 is likely to be on a relatively uniform and planar surface, and/or is likely to be on the same object in the simulated environment. In one example, the sensor engine may identify and evaluate the depths of the three nearest samples to the ray intersection point 706. The three nearest sample points in this instance may be sample points 710, 712, and 714, which form a triangle around the ray intersection point 706. In this example, if the depths of the three nearest sample points 710, 712, and 714 have the same object identifier, the sensor engine may assume that the ray intersection point 706 is on the same object, and may use linear interpolation to determine sensor data for the ray intersection point 706 based on the corresponding sensor data at the sample points 710, 712, and 714. Otherwise, the sensor engine may determine if triangle formed by sample points 710, 712, and 714 is sufficiently planar to the triangle formed by sample points 708, 714, and 716. In some examples, a curvature error parameter may be used to determine if these triangles (or other adjacent regions) are sufficiently planar. If the two triangles are sufficiently planar, then the sensor engine may use linear interpolation to determine sensor data for the ray intersection point 706 based on the corresponding sensor data at the sample points 710, 712, 714, and 716. Otherwise, the sensor engine may determine that sampling should be used instead of linear interpolation, and may determine sensor data for the ray intersection point 706 based on the corresponding sensor data for the nearest sample (e.g., sample point 708). Although this example describes one algorithm for performing spatial upsampling based on object identifiers and depth data, it can be understood from the context of this disclosure that other algorithms may be used in other example based on any combination of the sampling techniques, thresholds, and/or unified multi-sensor data described herein.

Figure 8:
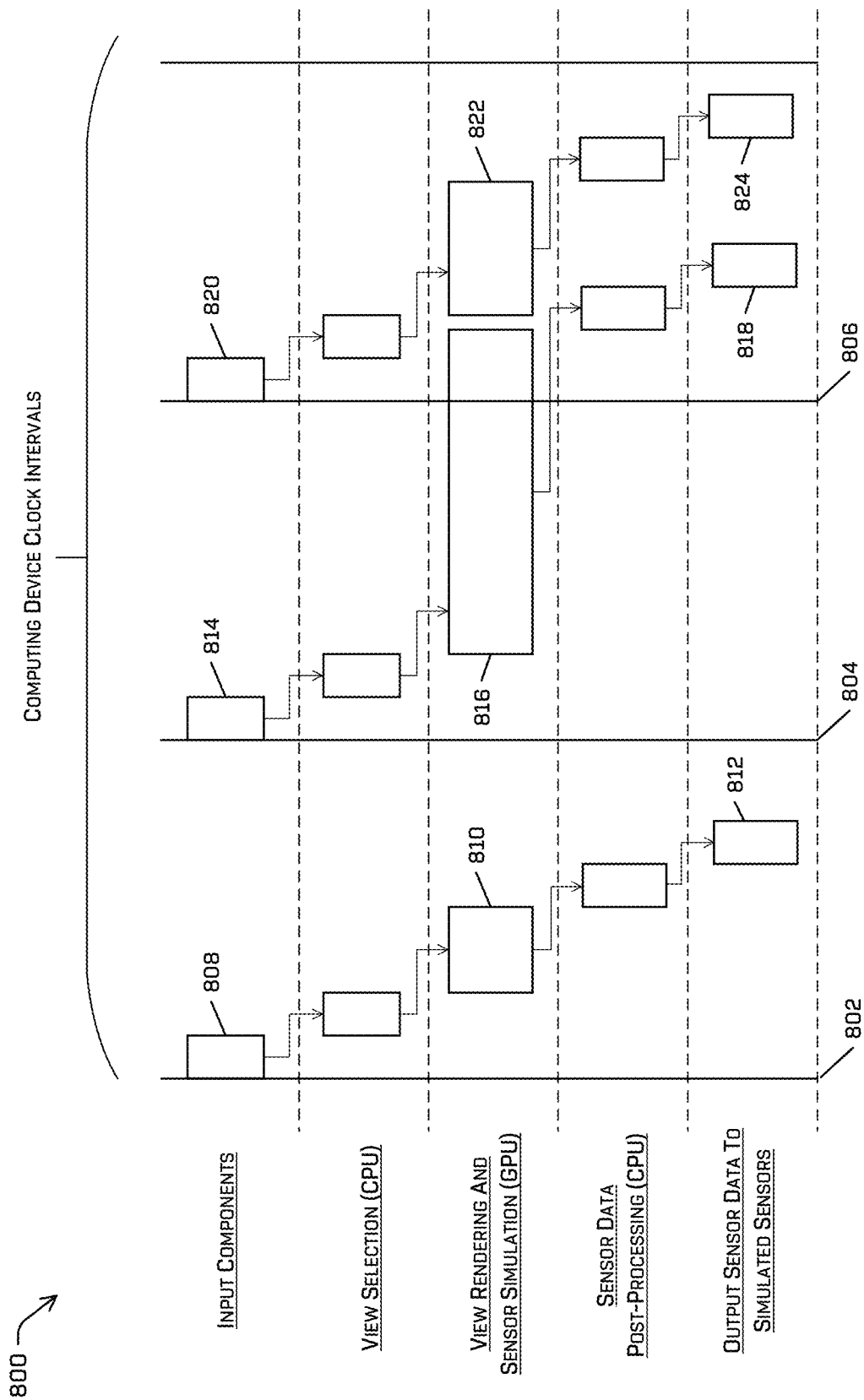
FIG. 8 illustrates an example technique for generating views of a simulated environment using a GPU, in accordance with one or more implementations of the disclosure.

FIG. 8 illustrates an example system 800 for rendering views of a simulated environment using a GPU. As noted above, in some examples the sensor engine may coordinate and manage the usage of one or more GPUs and CPUs when selecting, rendering, aligning, and/or upsampling (e.g., enhancing) the 2D views used to generate sensor input data during the simulation. In some cases, a GPU may be used to generate the sensor data (e.g., by rasterizing 2D views of the 3D simulated environment, ray tracing, reprojection, upsampling, etc.), and a CPU may be used for various pre-processing (e.g., view selection) and/or post-processing of the sensor data (e.g., message formatting and packing, and delivery of the sensor data to the simulated sensors) to provide the sensor data to the simulation. In this example, system 800 illustrates a processing pipeline for rendering 2D views that includes a GPU configured to perform view rendering, and one or more CPUs configured to perform pre- and post-processing functionality.

In this example, the sensor engine selects and initiates the rendering of a new/updated 2D view for the simulation at each clock interval 802-806. For instance, beginning at clock interval 802, input components are executed at processing block 808, pre-processing is performed by the CPU, the view is rendered by the GPU at block 810, post-processing is performed by the CPU, and the rendered 2D view is output to the simulated sensors at processing block 812. A similar processing pipeline is initiated at clock interval 804, which proceeds from processing block 814, includes GPU rendering at processing block 816, and outputs the rendered 2D view at processing block 818, and another similar processing pipeline is initiated at clock interval 806, including processing blocks 820, 822, and 824.

As shown in this example, the 2D view rendering pipeline of system 800 may operate asynchronously and independently respect to the CPU and GPU functionalities. For instance, processing block 820 initiates the generation of a new 2D view and performs CPU pre-processing functionality before the GPU completes the rendering of the previous 2D view in processing block 816. The asynchronous operation in this example minimizes GPU downtime and maximizes the speed and efficiency of rendering 2D views during the simulation. Further, the asynchronous and independent operation of the GPU and CPU in this example prevents undesirable dropped frames.

In various implementations, the 2D view rendering pipeline of system 800 also may be used to dynamically update the view rendering functionality during the simulation. For example, when the rasterization and/or ray tracing operations of the GPU(s) are determined to be the processing bottleneck, the sensor engine may reduce the rendering rate, reduce the view resolution, and/or determine views that can be shared by multiple sensors, in order to reduce the processing load on the GPU(s) and alleviate the bottleneck. In some cases, to compensate for a reduced rendering rate and/or lower resolution of the views rendered by the GPU, the sensor engine may perform additional ray tracing/ray casting operations, which may improve the temporal/spatial aligning and/or upsampling resulting in improved sensor input data while reducing the processing burden on the GPU. In other examples, the sensor engine may reduce the ray tracing/ray casting performed by the GPU and compensate with higher rendering rates and/or higher resolutions.

Figure 9:
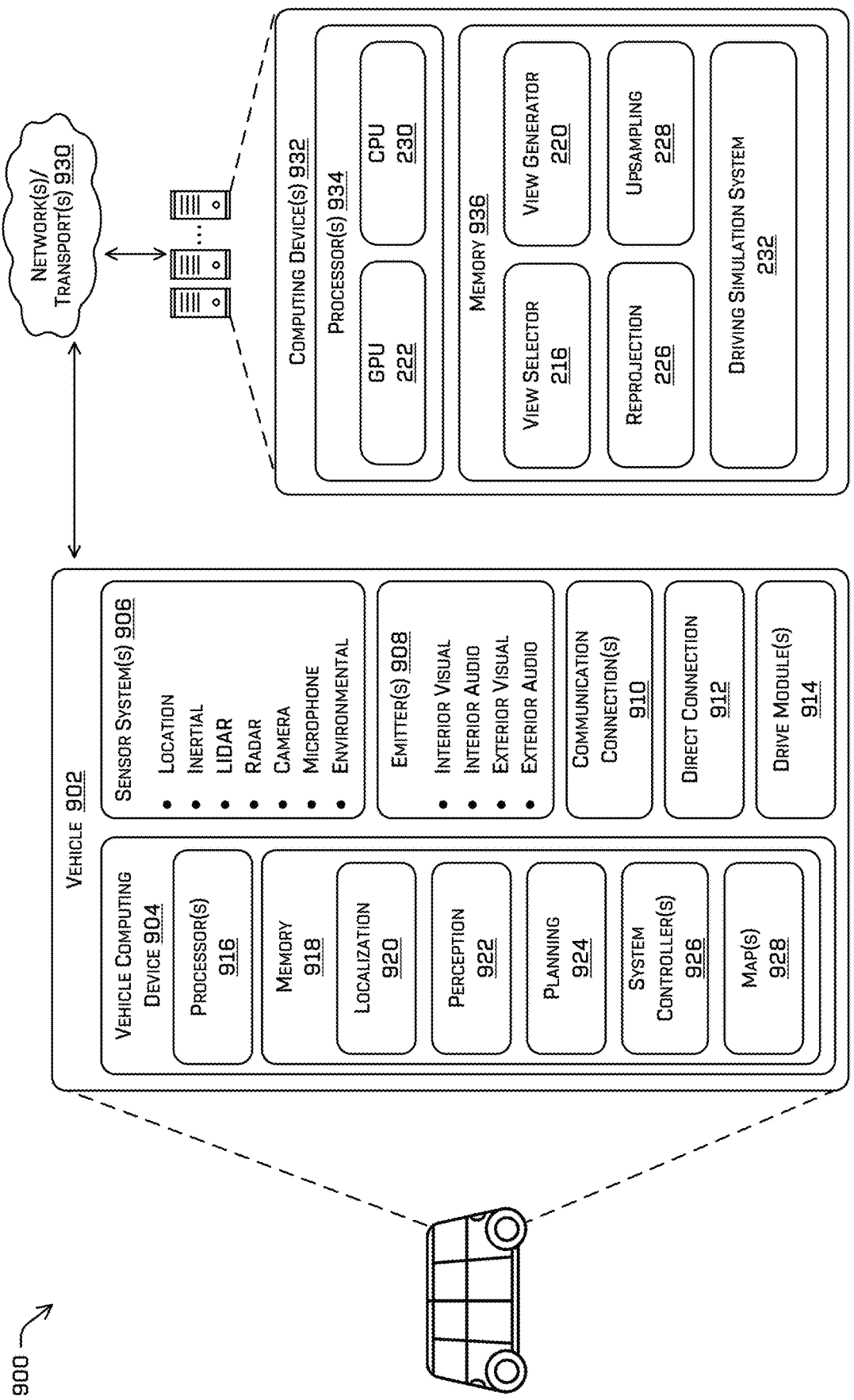
FIG. 9 depicts a block diagram of an example architecture for implementing various techniques described herein.

FIG. 9 depicts a block diagram of an example system 900 for implementing the techniques described herein. In at least one example, the system 900 can include a vehicle 902, which can be the same vehicle as the simulated vehicles 402 and 508, described above with reference to FIGS. 4 and 5. The system 900 also may include one or more computing devices 932, which can be implemented as a driving simulation system and/or sensor engine, and may be same as or similar to computing devices 202A and/or 202B described above with reference to FIG. 2.

The vehicle 902 may correspond to a physical autonomous vehicle traversing through a physical environment, and/or to a simulate vehicles operating within a virtual and/or log-based simulation. Both for implementations including real vehicles and simulated vehicles, the vehicle 902 may include various software-based and/or hardware-based components of an autonomous vehicle, and may be used to control autonomous vehicles traversing through physical or simulated environments.

The vehicle 902 can be a hardware-based and/or software-based controller for a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In some instances, a vehicle control system may operate within a real associated vehicle, such as a fully or partially autonomous vehicle having any other level or classification. In some instances, the techniques described herein may be usable by non-autonomous vehicles as well. Additionally or alternatively, the vehicle 902 may operate independently from a physical vehicle, for example, as a hardware and software-based controller for a simulated vehicle executing in a computing environment during the development, testing, and validation processes for the vehicle 902. In addition, while implementations of the vehicle 902 described herein may include simulating a control system of an autonomous vehicle, semi-autonomous vehicle, or a non-autonomous vehicle, some of the techniques may be in a simulated environment, using a simulated vehicle.

The vehicle 902 can be used for any configuration of real or simulated vehicles, such as, for example, a van, a sport utility vehicle, a cross-over vehicle, a truck, a bus, an agricultural vehicle, and/or a construction vehicle. For instance, the associated vehicle for the vehicle 902 can be powered by one or more internal combustion engines, one or more electric motors, hydrogen power, any combination thereof, and/or any other suitable power sources. Although the associated vehicle may have four wheels, the vehicle 902 and associated techniques described herein can be incorporated into vehicles having fewer or a greater number of wheels, and/or tires. The vehicle 902 can include systems to control vehicles having four-wheel steering and can operate generally with equal or similar performance characteristics in all directions, for example, such that a first end of the vehicle is the front end of the vehicle when traveling in a first direction, and such that the first end becomes the rear end of the vehicle when traveling in the opposite direction. Similarly, a second end of the vehicle is the front end of the vehicle when traveling in the second direction, and such that the second end becomes the rear end of the vehicle when traveling in the opposite direction. These example characteristics may facilitate greater maneuverability, for example, in small spaces or crowded environments, such as parking lots and/or urban areas.

In some examples, vehicle 902 can include a vehicle computing device 904, one or more sensor systems 906, one or more emitters 908, one or more communication connections 910, at least one direct connection 912, and one or more drive assemblies 914. The vehicle computing device 904 can include one or more processors 916 and memory 918 communicatively coupled with the one or more processors 916. In the illustrated example, the vehicle 902 is an autonomous vehicle; however, the vehicle 902 could be any other type of vehicle, or any other system having one or more sensor systems. In the illustrated example, the memory 918 of the vehicle computing device 904 stores a localization component 920, a perception component 922, a planning component 924, one or more system controllers 926, and one or more maps 928. Though depicted in FIG. 9 as residing in memory 918 for illustrative purposes, it is contemplated that the localization component 920, the perception component 922, the planning component 924, the one or more system controllers 926, and the one or more maps 928 may additionally, or alternatively, be accessible to the vehicle 902 (e.g., stored remotely).

In at least one example, the localization component 920 can include functionality to receive data from the sensor system(s) 906 to determine a position of the vehicle 902. For example, the localization component 920 can include and/or request/receive a map of an environment and can continuously determine a location of the autonomous vehicle within the map. In some instances, the localization component 920 can utilize SLAM (simultaneous localization and mapping) or CLAMS (calibration, localization and mapping, simultaneously) to receive image data, LIDAR data, radar data, IMU data, GPS data, wheel encoder data, and the like to accurately determine a location of the autonomous vehicle. In some instances, the localization component 920 can provide data to various components of the vehicle 902 to determine an initial position of an autonomous vehicle for generating a candidate trajectory, as discussed herein.

In some instances, the perception component 922 can include functionality to perform object detection, segmentation, and/or classification. In some examples, the perception component 922 can provide processed sensor data that indicates a presence of an entity that is proximate to the vehicle 902 and/or a classification of the entity as an entity type (e.g., car, pedestrian, cyclist, animal, building, tree, road surface, curb, sidewalk, unknown, etc.). In additional and/or alternative examples, the perception component 922 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

In general, the planning component 924 can determine a path for the vehicle 902 to follow to traverse through an environment. For example, the planning component 924 can determine various routes and trajectories and various levels of detail. For example, the planning component 924 can determine a route to travel from a first location (e.g., a current location) to a second location (e.g., a target location). For the purpose of this discussion, a route can be a sequence of waypoints for travelling between two locations. As non-limiting examples, waypoints include streets, intersections, global positioning system (GPS) coordinates, etc. Further, the planning component 924 can generate an instruction for guiding the autonomous vehicle along at least a portion of the route from the first location to the second location. In at least one example, the planning component 924 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique.

In at least one example, the vehicle computing device 904 can include one or more system controllers 926, which can be configured to control steering, propulsion, braking, safety, emitters, communication, and other systems of the vehicle 902. These system controller(s) 926 can communicate with and/or control corresponding systems of the drive assembly(s) 914 and/or other components of the vehicle 902.

The memory 918 can further include one or more maps 928 that can be used by the vehicle 902 to navigate within the environment. For the purpose of this discussion, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In one example, a map can include a three-dimensional mesh generated using the techniques discussed herein. In some instances, the map can be stored in a tiled format, such that individual tiles of the map represent a discrete portion of an environment, and can be loaded into working memory as needed. In at least one example, the one or more maps 928 may include at least one map (e.g., images and/or a mesh) generated in accordance with the techniques discussed herein. In some example, the vehicle 902 can be controlled based at least in part on the maps 928. That is, the maps 928 can be used in connection with the localization component 920, the perception component 922, and/or the planning component 924 to determine a location of the vehicle 902, identify objects in an environment, and/or generate routes and/or trajectories to navigate within an environment.

In some examples, the one or more maps 928 may be stored on a remote computing device(s) (such as the computing device(s) 932) accessible via network/transport component 930. In some examples, multiple maps 928 may be stored based on, for example, a characteristic (e.g., type of entity, time of day, day of week, season of the year, etc.). Storing multiple maps 928 may have similar memory requirements, but increase the speed at which data in a heat map may be accessed.

In some instances, aspects of some or all of the components discussed herein may include any models, algorithms, and/or machine learning algorithms. For example, in some instances, the components in the memory 918 (and the memory 936, discussed below) may be implemented as a neural network.

As described herein, an exemplary neural network is a biologically inspired algorithm which passes input data through a series of connected layers to produce an output. Each layer in a neural network may also comprise another neural network, or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Additional examples of architectures include neural networks such as ResNet70, ResNet101, VGG, DenseNet, PointNet, and the like.

In at least one example, the sensor system(s) 906 can include LIDAR sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 906 can include multiple instances of each of these or other types of sensors. For instance, the LIDAR sensors can include individual LIDAR sensors located at the corners, front, back, sides, and/or top of the vehicle 902. As another example, the camera sensors can include multiple cameras disposed at various locations about the exterior and/or interior of the vehicle 902. The sensor system(s) 906 can provide input to the vehicle computing device 904. Additionally or alternatively, the sensor system(s) 906 can send sensor data, via the one or more network/transport component 930, to the one or more computing device(s) at a particular frequency, after a lapse of a predetermined period of time, in near real-time, etc.

The vehicle 902 can also include one or more emitters 908 for emitting light and/or sound, as described above. The emitters 908 in this example include interior audio and visual emitters to communicate with passengers of the vehicle 902. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 908 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 902 can also include one or more communication connection(s) 910 that enable communication between the vehicle 902 and one or more other local or remote computing device(s). For instance, the communication connection(s) 910 can facilitate communication with other local computing device(s) on the vehicle 902 and/or the drive assembly(s) 914. Also, the communication connection(s) 910 can allow the vehicle to communicate with other nearby computing device(s) (e.g., other nearby vehicles, traffic signals, etc.). The communications connection(s) 910 also enable the vehicle 902 to communicate with a remote teleoperations computing device or other remote services.

The communications connection(s) 910 can include physical and/or logical interfaces for connecting the vehicle computing device 904 to another computing device or a network, such as network/transport component 930. For example, the communications connection(s) 910 can enable Wi-Fi-based communication such as via frequencies defined by the IEEE 802.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s). Network/transport component 930 may include one or any combination of communication networks described herein. In some examples, the network/transport component 930 may provide communications using other techniques such as shared memory, in-process communication, and/or shared used of the same physical hardware, in addition to or as an alternative to communication networks.

In at least one example, the vehicle 902 can include one or more drive assemblies 914. In some examples, the vehicle 902 can have a single drive assembly 914. In at least one example, if the vehicle 902 has multiple drive assemblies 914, individual drive assemblies 914 can be positioned on opposite ends of the vehicle 902 (e.g., the front and the rear, etc.). In at least one example, the drive assembly(s) 914 can include one or more sensor systems to detect conditions of the drive assembly(s) 914 and/or the surroundings of the vehicle 902. By way of example and not limitation, the sensor system(s) can include one or more wheel encoders (e.g., rotary encoders) to sense rotation of the wheels of the drive assemblies, inertial sensors (e.g., inertial measurement units, accelerometers, gyroscopes, magnetometers, etc.) to measure orientation and acceleration of the drive assembly, cameras or other image sensors, ultrasonic sensors to acoustically detect objects in the surroundings of the drive assembly, LIDAR sensors, radar sensors, etc. Some sensors, such as the wheel encoders can be unique to the drive assembly(s) 914. In some cases, the sensor system(s) on the drive assembly(s) 914 can overlap or supplement corresponding systems of the vehicle 902 (e.g., sensor system(s) 906).

The drive assembly(s) 914 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive assembly(s) 914 can include a drive assembly controller which can receive and preprocess data from the sensor system(s) and to control operation of the various vehicle systems. In some examples, the drive assembly controller can include one or more processors and memory communicatively coupled with the one or more processors. The memory can store one or more programs or instructions to perform various functionalities of the drive assembly(s) 914. Furthermore, the drive assembly(s) 914 also include one or more communication connection(s) that enable communication by the respective drive assembly with one or more other local or remote computing device(s).

In at least one example, the localization component 920, perception component 922, and/or the planning component 924 can process sensor data, as described above, and can send their respective outputs, over the one or more network/transport component 930, to one or more computing device(s) 932. In at least one example, the localization component 920, the perception component 922, and/or the planning component 924 can send their respective outputs to the one or more computing device(s) 932 at a particular frequency, after a lapse of a predetermined period of time, in near real-time, etc.

As described above with reference to FIGS. 1-8, and as discussed throughout this disclosure, the vehicle 902 can send sensor data to one or more computing device(s) 932, via the network/transport component 930. In some examples, the vehicle 902 can send raw sensor data to the computing device(s) 932. In other examples, the vehicle 902 can send processed sensor data and/or representations of sensor data to the computing device(s) 932. In some examples, the vehicle 902 can send sensor data to the computing device(s) 932 at a particular frequency, after a lapse of a predetermined period of time, in near real-time, etc. In some cases, the vehicle 902 can send sensor data (raw or processed) to the computing device(s) 932 as one or more log files.

During a driving simulation, the computing device(s) 932 can execute the simulation including the simulated environment and/or simulated agents/objects. The computing device(s) 932 may provide the simulation data to the vehicle 902 in the form of sensor data to be detected and processed by the sensor system(s) 906 of the vehicle. During a simulation, the vehicle 902 may respond to the sensor input provided by the computing device(s) 932, while the simulation environment and agents/object executing on the computing device(s) 932 may detect and respond to the vehicle control commands output by the vehicle 902 (e.g., via the system controller 926) that control the movement and other actions performed by the vehicle 902.

In at least one example, the computing device(s) 932 can include one or more processors 934 and memory 936 communicatively coupled with the one or more processors 934. In the illustrated example, the memory 936 of the computing device(s) 932 stores the view selector component 216, the view generator component 222, the reprojection component 226, the upsampling component 228, and the driving simulation system 234. In at least one example, the computing device(s) 932 can correspond to the computing device(s) 202 of FIG. 2, and the components depicted within the computing device(s) 932 may be similar or identical to the corresponding components described above in connection with FIG. 2.

The processor(s) 916 of the vehicle 902 and the processor(s) 934 of the computing device(s) 932 can be any suitable processor capable of executing instructions to process data and perform operations as described herein. By way of example and not limitation, the processor(s) 916 and 934 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 918 and memory 936 are examples of non-transitory computer-readable media. Memory 918 and memory 936 can store an operating system and one or more software applications, instructions, programs, and/or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 9 is illustrated as a distributed system, in alternative examples, components of the vehicle 902 can be associated with the computing device(s) 932 and/or components of the computing device(s) 932 can be associated with the vehicle 902. That is, the vehicle 902 can perform one or more of the functions associated with the computing device(s) 932, and vice versa.

FIGS. 10-14 illustrate example processes in accordance with examples of the disclosure. These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Figure 10:
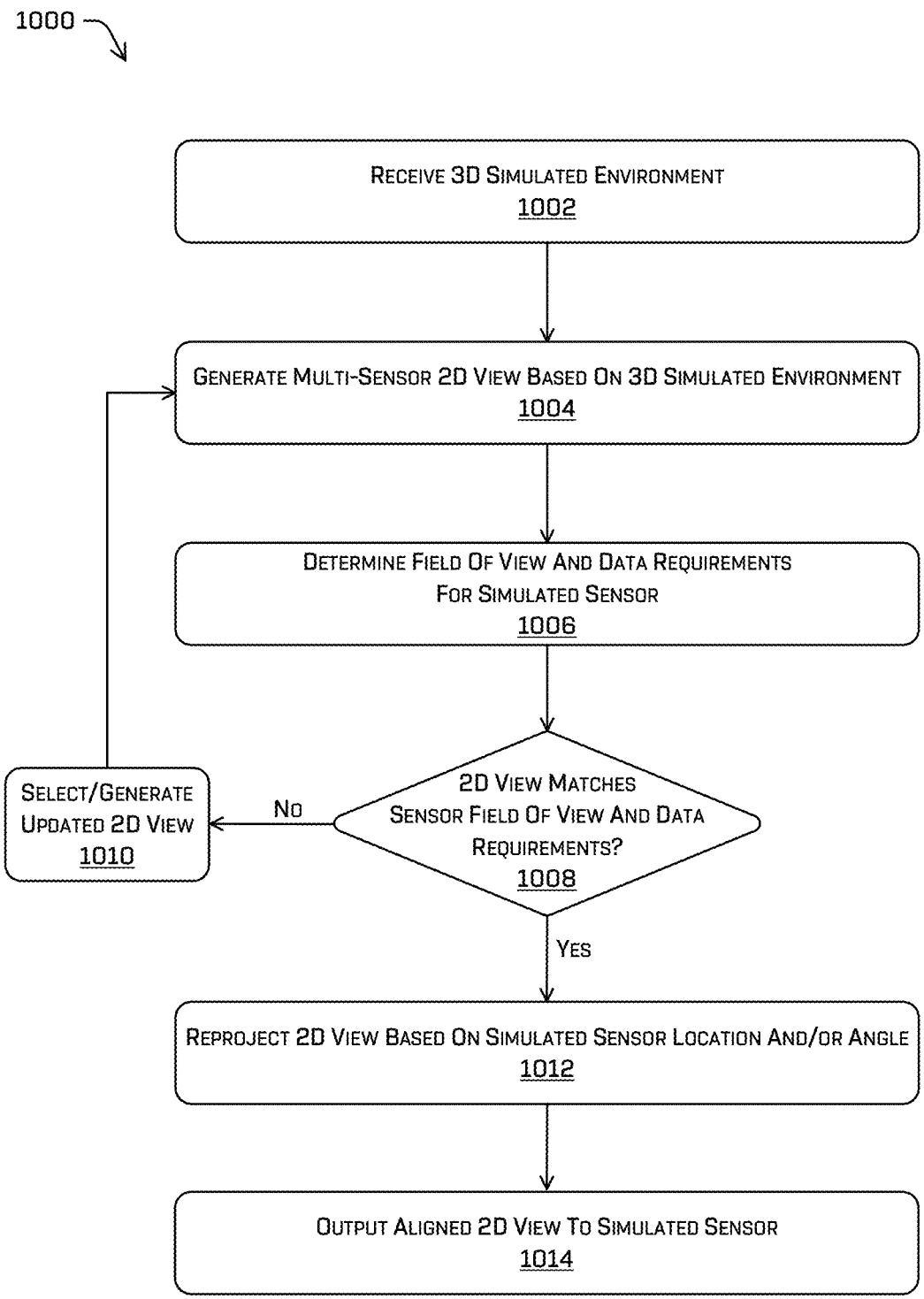
FIG. 10 depicts an example process for generating and using a multi-sensor view of a simulated environment to provide data to a simulated sensor, in accordance with one or more implementations of the disclosure.

FIG. 10 depicts an example process 1000 for generating and using a multi-sensor view of a simulated environment, and providing data to a simulated sensor. Some or all of the operations described in process 1000 can be performed by one or more components in FIGS. 1-9, such as the view selector component 216, view generator component 222, and/or other components with one or more computing device(s) 202 implementing a sensor simulation system (or sensor engine).

At operation 1002, the sensor engine may receive data representing a 3D simulated environment associated with a driving simulation. The 3D simulated environment may include a number of static and/or dynamic objects (e.g., agents), which may include software-based objects controlled within the simulated environment based on artificial intelligence(s) and/or other algorithms.

At operation 1004, the sensor engine may generate a multi-sensor 2D view based on the 3D simulated environment. In some examples, operation 1004 may be performed by a view generator component 222, using a GPU configured to render 2D views by rasterizing the 3D simulated environment from a perspective location of the simulated vehicle. The generated 2D view may include multiple types of sensor data associated each region (e.g., pixel) of the 2D view, including but not limited to image data (e.g., light and color data), depth data, object identifiers, velocity data, material data, etc., for each pixel of the view. For each discreet pixel or other region within the 2D view, the sensor engine may generate an array, data structure, or other storage configuration capable of storing the multi-sensor data for the region.

At operation 1006, the sensor engine may determine sensor dependency data, including a field of view and/or data requirements associated with a sensor operating in the simulated environment. The field of view for a sensor may be based on the position and the orientation angle of the sensor within the simulated environment. Additionally, data requirements for the sensor may correspond to the types of data that the sensor is configured to detect, and may include any combination of physical properties of the objects within the simulated environment. For instance, image sensors (e.g., cameras) are configured to detect light and color data from the simulated environment, radar sensors may be configured to detect the distance of objects from the sensor (which may be referred to as depth from the perspective of the sensor) and object velocity data, and lidar sensors may be configured to detect data, material properties (e.g., material type/composition, reflectance, roughness, etc.), etc.

At operation 1008, the sensor engine may determine if the 2D view generated in operation 1004 matches the field of view and data requirements determined in operation 1006 for the sensor. The sensor engine may determine a match between a 2D view and simulated sensor by determining if the field of view of the sensor is covered by the 2D view, and if the type of data stored in the 2D view corresponds to the data requirements of the sensor.

When the 2D view does not match the sensor dependency data (1008:No), process 1000 continues to operation 1010 at which the sensor engine generates an updated multi-sensor 2D view associated with the sensor before returning to operation 1004. Otherwise, when the 2D view matches the sensor dependency data (1008:Yes), process 1000 continues to operation 1012, at which the sensor engine aligns the 2D view based on the location and/or orientation angle of the sensor relative to the view.

At operation 1014, after aligning the 2D view with the simulated sensor, the sensor engine may output the data of the aligned 2D view as input data for the simulated sensor. In some examples, the sensor engine may provide the 2D view to a driving simulation system 234 that may integrate the updated view into a running simulation, after which the simulated sensors may receive input data based on the updated view.

Figure 11:
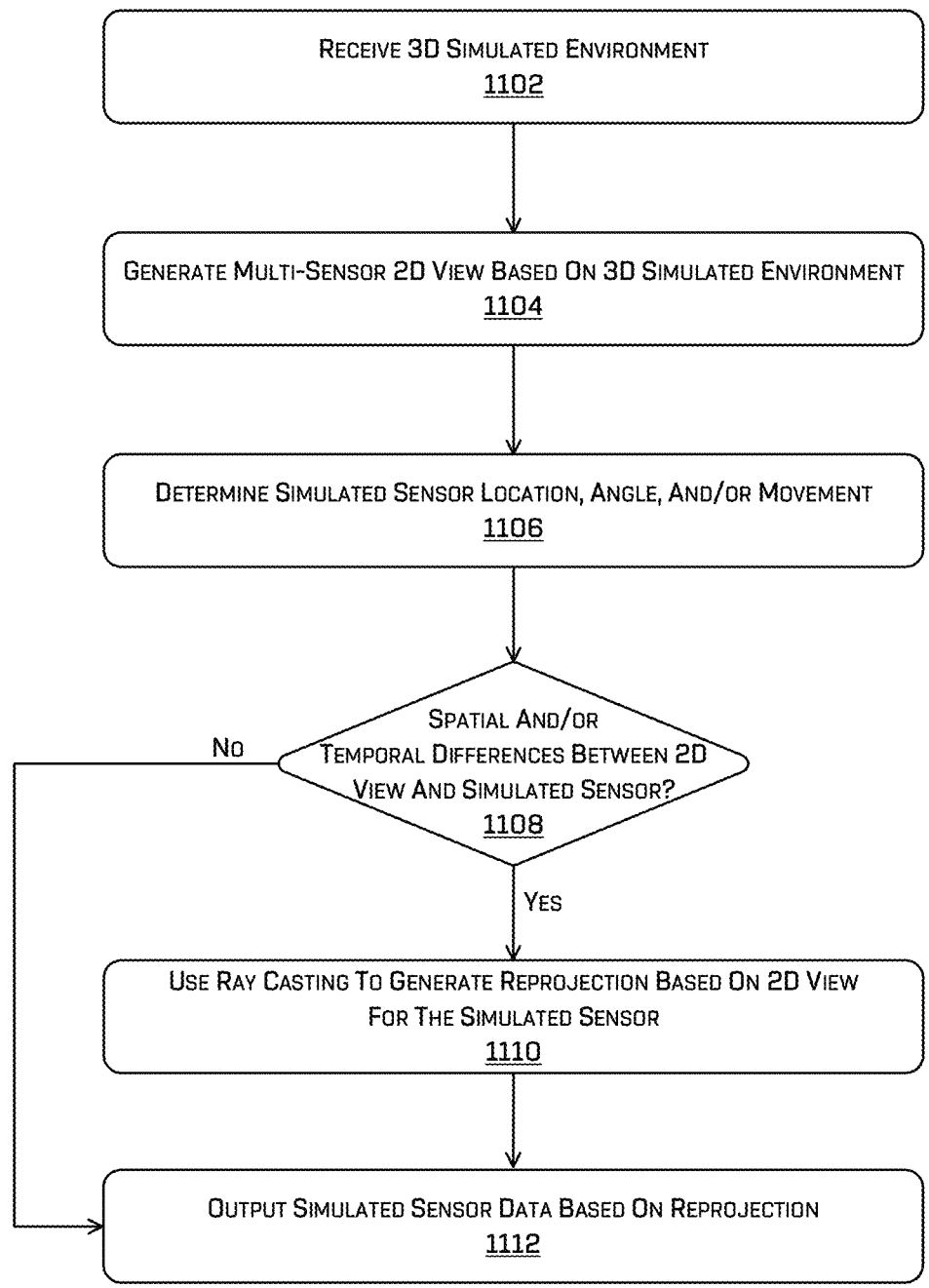
FIG. 11 depicts an example process for generating and reprojecting a view of a simulated environment to provide data to a simulated sensor, in accordance with one or more implementations of the disclosure.

FIG. 11 depicts an example process 1100 for generating and reprojecting a 2D view of a simulated environment to provide data to a simulated sensor. Some or all of the operations described in process 1100 can be performed by one or more components in FIGS. 1-9, such as the view generator component 222, reprojection component 226, and/or other components with one or more computing device(s) 202 implementing a sensor simulation system (or sensor engine).

At operation 1102, the sensor engine may receive data representing a 3D simulated environment associated with a driving simulation. The 3D simulated environment may include a number of static and/or dynamic objects (e.g., agents), which may include software-based objects controlled within the simulated environment based on artificial intelligence(s) and/or other algorithms.

At operation 1104, the sensor engine may generate a multi-sensor 2D view based on the 3D simulated environment. In some examples, operation 1104 may be performed by a view generator component 222, using a GPU configured to render 2D views by rasterizing the 3D simulated environment from a perspective location of the simulated vehicle. The generated 2D view may include multiple types of sensor data associated each region (e.g., pixel) of the 2D view, including but not limited to image data (e.g., light and color data), depth data, object identifiers, velocity data, material data, etc., for each pixel of the view. For each discreet pixel or other region within the 2D view, the sensor engine may generate an array, data structure, or other storage configuration capable of storing the multi-sensor data for the region.

At operation 1106, the sensor engine may determine a location, orientation angle, and/or movement data for a sensor operating in the simulation. The location and orientation angle of the sensor may be determined relative to the 2D view. Additionally, the movement of the sensor may be determined relative to the time at which the 2D view was rendered, and thus may indicate whether the sensor as moved (e.g., positionally and/or rotationally) since the 2D view was generated.

At operation 1108, the sensor engine may determine if any spatial and/or temporal differences exist between the 2D view generated in operation 1104 and the sensor alignment data determined in operation 1106 for the sensor. The sensor engine may determine a match between a 2D view and simulated sensor by comparing the sensor position, angle, and/or to predetermined alignment thresholds.

When no significant differences are determined between the alignment of the simulated sensor and the 2D view (1108:No), the process 1100 may proceed to operation 1112 at which the sensor engine outputs the data of the aligned 2D view as input data for the simulated sensor. In this case, the sensor engine determines that the sensor and the 2D view to which the sensor is mapped are sufficient aligned and the 2D view need not be reprojected.

Otherwise, when the sensor engine determines that the position, angle, and/or movement of the simulated sensor are not sufficiently aligned with the 2D view (1108:Yes), process 1100 continues to operation 1110, at which the sensor engine initiates a reprojection operation to temporally and/or spatially align the 2D view based on the position, angle, and/or movement of the sensor relative to the 2D view. In some examples, the reprojection component 226 may use ray casting and/or ray tracing to reproject the rendered 2D view, by casting rays from the location of the sensor within the simulated environment toward the 2D view to determine ray intersection points. The visual and/or depth data associated with the ray intersection points may be used to align the 2D view, compute shadowing and masking information, and simulate various visual effects.

At operation 1112, after the reprojection is generated to align the 2D view with the simulated sensor, the sensor engine may output the data of the aligned 2D view as input data for the simulated sensor. In some examples, the sensor engine may provide the 2D view to a driving simulation system 234 that may integrate the updated view into a running simulation, after which the simulated sensors may receive input data based on the updated view.

Figure 12:
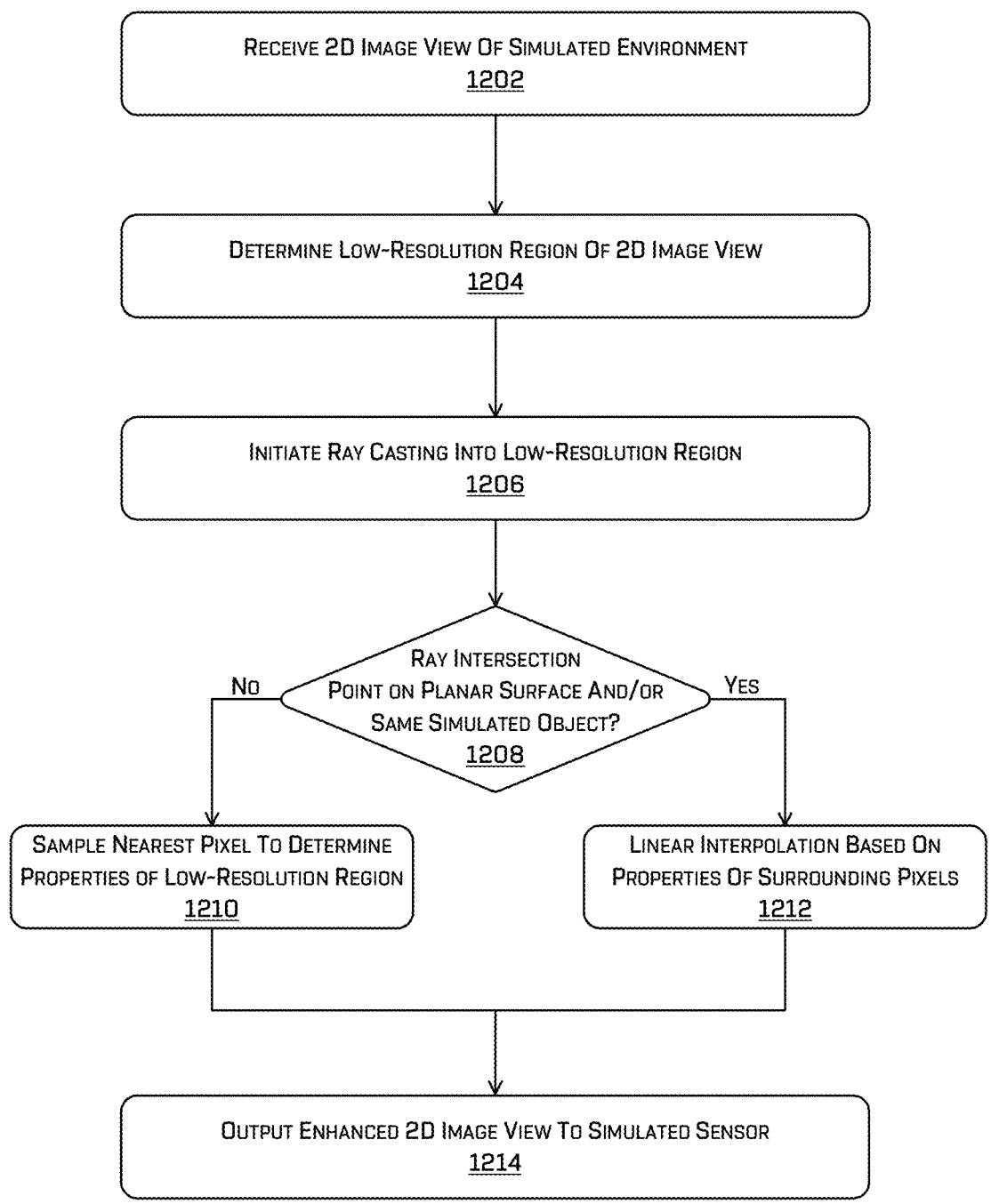
FIG. 12 depicts an example process for depth-aware spatial upsampling, in which linear interpolation and/or sampling is used to enhance a 2D view of a simulated environment, in accordance with one or more implementations of the disclosure.

FIG. 12 depicts an example process 1200 for depth-aware spatial upsampling, in which linear interpolation and/or sampling is used to enhance a 2D view of a simulated environment. Some or all of the operations described in process 1200 can be performed by one or more components in FIGS. 1-9, such as the view generator component 222, upsampling component 228, and/or other components with one or more computing device(s) 202 implementing a sensor simulation system (or sensor engine).

At operation 1202, the sensor engine may receive a 2D view of a simulated environment. In some examples, the 2D view may include "unified" 2D views having multi-sensor image data (e.g., visual data, depth data, object identifiers, velocity data, material data, etc.) associated with each region (e.g., pixel) of the view.

At operation 1204, the sensor engine may determine one or more low-resolution portions of the 2D view. For example, a small object in the distance/background of an the 2D view may have fewer pixels allotted to it, and thus may be rendered at a relatively lower resolution for both the visible and non-visible data of the 2D view.

At operation 1206, the sensor engine may cast one or more rays into the low-resolution region of the 2D view. For example, a ray may be cast into a bounding box associated with the low-resolution portion of the 2D view, and the ray casting may be used to determine a ray intersection point within the depth data (e.g., depth image or depth buffer) of the 2D view.

At operation 1208, the sensor engine evaluates the depth data for adjacent regions and/or other nearby regions of the 2D view, to determine whether the ray intersection point is associated with a relatively planar surface. In various examples, the sensor engine may evaluate the depth data for the adjacent regions (e.g., pixels) using various different techniques and algorithms. For example, the sensor engine may evaluate one or more triangles with respect to a curvature error parameter to determine the triangles (or other regions surrounding or adjacent to the ray intersection) are sufficiently planar.

When determining that the ray intersection point is not on a relatively planar surface in the simulated environment (1208:No), then at operation 1210 the sensor engine determines sensor data associated with the ray intersection point based on a nearest sample to the ray intersection point.

Otherwise, when determining that the ray intersection point is on a relatively planar surface in the simulated environment (1210:No), then at operation 1212 the sensor engine performs a linear interpolation operation, using the sensor data from the adjacent or surrounding pixels to determine the sensor data for the ray intersection point.

At operation 1214, the sensor engine outputs the enhanced 2D view to the simulated sensor. In some examples, the sensor engine may provide the 2D view to a driving simulation system 234 that may integrate the enhanced view into a running simulation, after which the simulated sensors may receive input data based on the enhanced view. The enhanced 2D view may correspond to a view having a higher-resolution across some or all of the view, based on the incorporation of the additional sensor data determined using the depth-aware upsampling described herein. Additionally, although this example describes an upsampling technique using depth data, in other examples similar or identical upsampling techniques may use object identifier data and/or velocity data instead of or in conjunction with depth data.

Figure 13:
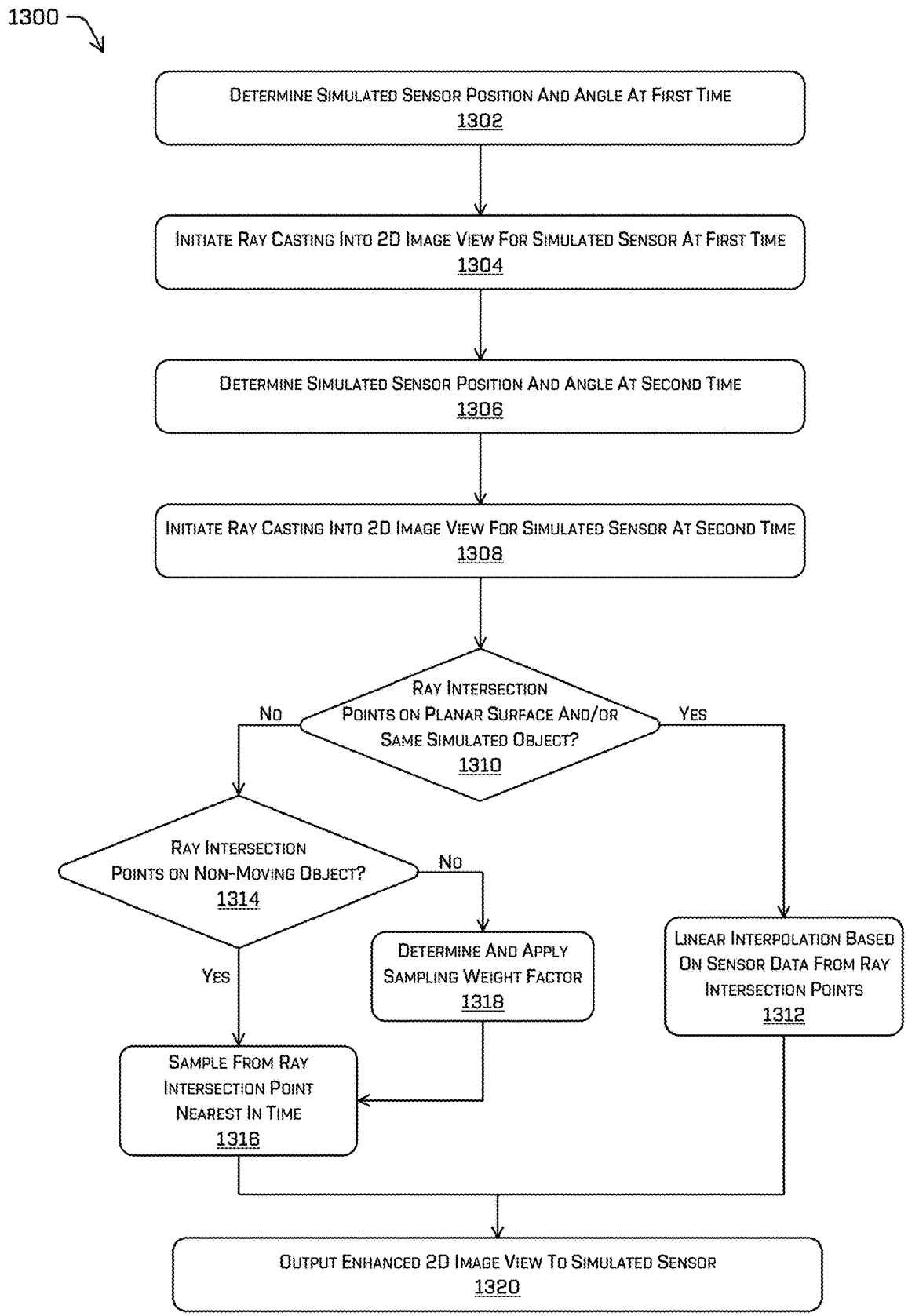
FIG. 13 depicts an example process object-aware and velocity-aware temporal upsampling, in which linear interpolation and/or sampling is used to generate sensor data between time intervals, in accordance with one or more implementations of the disclosure.

FIG. 13 depicts an example process 1200 object-aware and velocity-aware temporal upsampling, in which linear interpolation and/or sampling is used to generate sensor input data between time intervals. Some or all of the operations described in process 1300 can be performed by one or more components in FIGS. 1-9, such as the view generator component 222, upsampling component 228, and/or other components with one or more computing device(s) 202 implementing a sensor simulation system (or sensor engine).

At operation 1302, the sensor engine determines a position and an orientation angle for a sensor operating in the simulation at a first time. At operation 1304, the sensor engine casts a ray from the sensor into an associated 2D view, based on the sensor position and orientation at the first time.

At operation 1306, the sensor engine determines a position and an orientation angle for a sensor operating in the simulation at a second time. At operation 1308, the sensor engine casts a ray from the sensor into an associated 2D view, based on the sensor position and orientation at the first time. In some examples, the position and/or orientation of the sensor may change between the first time and the second time. As discussed above, in some cases the position and/or orientation of the sensor may change based on the movement of the simulated vehicle as it traverses the environment during the simulation. Additionally or alternatively, the sensor may be configured to move and/or rotate independently of the simulated vehicle.

At operation 1310, the sensor engine may compare the depths and/or object identifiers associated with the ray intersection points determined in operations 1304 and 1308. In this example, if the ray intersection points determined for the sensor at the first time and the second time are associated with the same object identifier and/or on a relatively planar surface (1310:Yes), then at operation 1312 the sensor engine may perform a linear interpolation operation, using the sensor data associated with the two ray intersection points, to determine sensor data associated with intermediate simulation time between the first time and second time.

Otherwise, if the ray intersection points determined for the sensor at the first and second times are associated with different object identifiers and/or are not positioned on a relatively planar surface (1310:No), then at operation 1314 the sensor engine may further evaluate the velocity data associated with the ray intersection points to determine whether the ray intersection points for both the first and second times are on non-moving objects. In this example, if the sensor engine determines that both ray intersection points are positioned on non-moving objects in the environment (1314:Yes), then at operation 1316 the sensor engine may determine the sensor data value(s) for the intermediate simulation time that sampling from the ray intersection point that is nearest in time to the intermediate simulation time. For instance, if the first time is 0.0 secs and the second time is 1.0 secs, than at operation 1316 the sensor data associated with an intermediate simulation time of 0.4 secs would be assigned the corresponding sensor data value at the first time, while the sensor data associated with an intermediate simulation time of 0.6 secs would be assigned the corresponding sensor data value at the second time. These solutions are in contrast to the linear interpolation performed in operation 1312, in which the sensor data associated with an intermediate simulation time would be generated based on the sensor data values at both the first and second times.

Continuing with this example, the sensor engine determines in operation 1314 that one or both of the ray intersection points are positioned on moving objects (1314:No), then at operation 1318 the sensor engine may determine and apply a sampling weight factor, before sampling from the ray intersection points in operation 1316. The sampling weight factor determined in operation 1318 may be based on which of ray intersection points is on a simulated object that is moving, as well as the velocity and direction of the moving simulated object. For instance, a small and/or fast-moving object detected at the first time may be more likely to have moved away during the intermediate simulation time, and thus the sampling weight factor may shift the neural weight factor halfway between the first and second time (e.g., 0.5 secs), to a lower value (e.g., 0.3 secs) which may cause the sensor engine to sample based on the second ray intersection point more often than the first ray intersection point.

At operation 1320, the sensor engine outputs the enhanced 2D view to the simulated sensor. In some examples, the sensor engine may provide the 2D view to a driving simulation system 234 that may integrate the enhanced view into a running simulation, after which the simulated sensors may receive input data based on the enhanced view. The enhanced 2D view may correspond to a view having a higher rendering rate, based on the incorporation of the additional sensor data determined using the temporal upsampling described herein. Additionally, although this example describes an upsampling technique using a particular algorithm based on object identifiers, depth data, and velocities, in other examples similar or identical temporal upsampling techniques may use other unified view data with various algorithms in other combinations.

Figure 14:
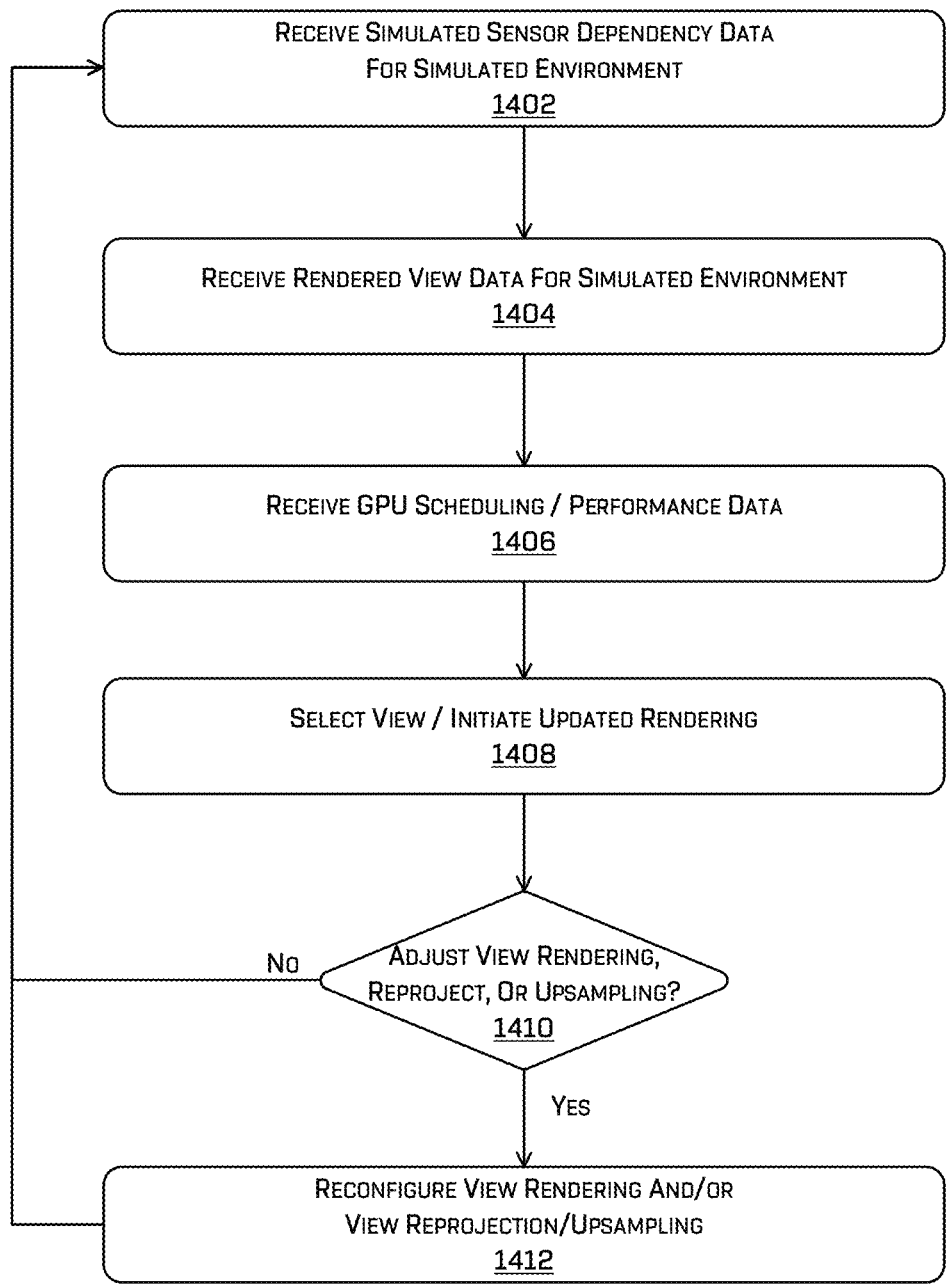
FIG. 14 depicts an example process using sensor dependency data, view data, and GPU scheduling data to determine a view for rendering in a simulated environment, in accordance with one or more implementations of the disclosure.

FIG. 14 depicts an example process 1400 using sensor dependency data, view data, and GPU scheduling data to determine a view for rendering in a simulated environment. Some or all of the operations described in process 1200 can be performed by one or more components in FIGS. 1-9, such as the view selector component 216 and/or other components with one or more computing device(s) 202 implementing a sensor simulation system (or sensor engine).

At operation 1402, the sensor engine may receive sensor dependency data for one or more sensors operating in a simulated environment. In various examples, sensor dependency data may include the position, orientation angle, and/or field of view of the sensor within the simulated environment, along with the type(s) of data that the sensor is configured to detect.

At operation 1404, the sensor engine may receive view data associated with one or more rendered views in the simulated environment. The simulation view data may include, for each view rendered in the simulation, the location (e.g., focal point) of the view, the orientation (e.g., angle) of the view, the types of data stored for the discreet regions (e.g., pixels) of the view, and the rendering times/rates associated with the view.

At operation 1406, the sensor engine may receive or determine scheduling and/or performance data for one or more GPUs and/or CPUs associated with the driving simulation. The scheduling and performance data for the CPU(s) 218 and GPU(s) 224 may include capacities of the available GPU(s) for rendering 2D views (e.g., cores, GPU speed, storage, current rendering backlog, latency, network speed) and/or the capacities of the available CPU(s) to perform pre-processing and post-processing operations in connection with rendering new views by the GPU.

At operation 1408, the sensor engine may select a view and initiate an updated rendering of the selected view via the GPU. As described above, in various different implementations the view selector component 216 may use different combinations of the data received in operations 1402-1406, and may apply any of the various heuristics-based algorithms and/or machine-learning models described herein to determine which view(s) are to be rendered at the current time during the simulation.

At operation 1410, the sensor engine may analyze the performance of the simulation and computing resources (e.g., GPU and CPU) to determine whether to adjust the view resolution and/or rendering rate for 2D views rendered by the GPU, and/or the view-sensor alignment and/or upsampling performed by the CPU. For example, the sensor engine may identify one or more operations (e.g., rasterization by the GPU, ray tracing by the CPU) as processing bottlenecks that may negatively impact the simulation performance. In some instances, the sensor engine may apply one or more algorithms or machine-learning models to determine an optimal rendering rate, view configuration, view resolution, in order to reduce the processing load on the GPU(s) and alleviate the bottleneck. Additionally or alternatively, the sensor engine may apply one or more algorithms or machine-learning models to determine optimal timing and configuration for ray tracing and/or upsampling operations used to improve the sensor/view alignments and perform temporal/spatial enhancements of the sensor input data by the CPU.

When the sensor engine determines an optimization that includes an adjustment to the GPU view rendering functionality (e.g., view resolution and/or rendering rate) or the CPU view processing functionality (e.g., view-sensor alignment and/or upsampling configurations) (1410:Yes), then at operation 1412 the sensor engine may reconfigure the view generator component 222, reprojection component 226, and/or upsampling component 228 to implement the adjusted view resolution, rendering rate, and the alignment and/or upsampling configurations. Otherwise, when the sensor engine determines no optimization including an adjustment to the view resolution, rendering rate, alignment and/or upsampling configurations (1410:No), then process 1400 may return to operation 1402 to determine the next view to render.

Example Clauses

A. A system comprising: one or more processors; and one or more computer-readable media storing computer-executable instructions that, when executed, cause the one or more processors to perform operations comprising: determining data representing a three-dimensional environment associated with a driving simulation; determining a location associated with a simulated vehicle in the three-dimensional environment; generating a two-dimensional view of the three-dimensional environment, based at least in part on the location of the simulated vehicle, wherein the two-dimensional view includes first data indicating a first physical property associated with a region of the two-dimensional view, and second data indicating a second physical property associated with the region; generating first sensor data based at least in part on the two-dimensional view, wherein the first sensor data includes the first data, and wherein the first sensor data is associated with a first simulated sensor of the simulated vehicle; generating second sensor data based at least in part on the two-dimensional view, wherein the second sensor data includes the second data, and wherein the second sensor data is associated with a second simulated sensor of the simulated vehicle; and providing the first sensor data and the second sensor data to the simulated vehicle during the driving simulation.

B. The system of paragraph A, wherein: generating the first sensor data comprises generating a first reprojection of the two-dimensional view based at least in part on a first sensor location associated with the first simulated sensor; and generating the second sensor data comprises generating a second reprojection of the two-dimensional view based at least in part on a second sensor location associated with the second simulated sensor, relative to the location of the simulated vehicle, wherein the first sensor location is different from the second sensor location.

C. The system of paragraph A, wherein: the first simulated sensor includes a camera, and the first sensor data includes light data associated with the region of the two-dimensional view; and the second simulated sensor includes at least one of a lidar sensor or a radar sensor, and the second sensor data includes at least one of velocity data or material data associated with the region of the two-dimensional view.

D. The system of paragraph A, wherein generating the first sensor data comprises: determining a first sensor pose associated with the first simulated sensor; determining a first sensor simulation time associated with the first sensor; and generating a reprojection of the two-dimensional view for the first simulated sensor, based at least in part on the first sensor pose and the first sensor simulation time.

E. The system of paragraph D, wherein: generating the two-dimensional view of the three-dimensional environment comprises performing a rasterization process; and generating the first sensor data comprises performing a ray casting process to generate a first reprojection of the two-dimensional view.

F. A method comprising: receiving data representing a three-dimensional simulated environment; generating a two-dimensional view of the three-dimensional simulated environment; determining a first metadata and second metadata associated with a region of the two-dimensional view; determining first sensor data based at least in part on the two-dimensional view, wherein the first sensor data includes the first metadata; providing the first sensor data to a first simulated sensor configured to detect the first metadata; determining second data based at least in part on the two-dimensional view, wherein the second sensor data includes the second metadata; and providing the second sensor data to a second simulated sensor configured to detect the second metadata.

G. The method of paragraph F, wherein: determining the first sensor data comprises generating a first reprojection of the two-dimensional view based at least in part on a first sensor location of the first simulated sensor within the three-dimensional simulated environment; and determining the second sensor data comprises generating a second reprojection of the two-dimensional view based at least in part on a second sensor location of the second simulated sensor within the three-dimensional simulated environment, wherein the first sensor location is different from the second sensor location.

H. The method of paragraph F, wherein: generating the first sensor data comprises generating a first reprojection of the two-dimensional view based at least in part on a first simulated sensor time associated with the first simulated sensor; and generating the second sensor data comprises generating a second reprojection of the two-dimensional view based at least in part on a second simulated sensor time associated with the second simulated sensor, wherein the first simulated sensor time is different from the second simulated sensor time.

I. The method of paragraph F, wherein: the first simulated sensor includes a camera, and the first metadata includes light data associated with the region of the two-dimensional view; and the second simulated sensor includes at least one of a lidar sensor or a radar sensor, and the second metadata includes at least one of velocity data or material data associated with the region of the two-dimensional view.

J. The method of paragraph F, wherein generating the first sensor data comprises: determining a first sensor location associated with the first simulated sensor within the three-dimensional simulated environment; and generating a reprojection of the two-dimensional view, based at least in part on a difference between the first sensor location and a view focal point location associated with the two-dimensional view, wherein generating the two-dimensional view comprises performing a rasterization process, and wherein generating the reprojection of the two-dimensional view comprises performing a ray casting process.

K. The method of paragraph F, wherein determining the first sensor data comprises: determining a first simulated sensor time associated with the first simulated sensor; and generating a reprojection of the two-dimensional view, based at least in part on a time difference between the first simulated sensor time and a time associated with generating the two-dimensional view, wherein generating the two-dimensional view comprises performing a rasterization process, and wherein generating the reprojection of the two-dimensional view comprises performing a ray casting process.

L. The method of paragraph K, further comprising: determining a first movement of the first simulated sensor within the three-dimensional simulated environment, during a time period associated with the time difference; and determining a second movement of a simulated object represented within the two-dimensional view, during the time period, wherein generating the reprojection of the two-dimensional view is further based at least in part on the first movement and the second movement.

M. The method of paragraph F, wherein generating the two-dimensional view comprises: storing camera data at a first storage location associated with the region; storing lidar data at a second storage location associated with the region; storing radar data at a third storage location associated with the region; and storing an object identifier at a fourth storage location associated with the region.

N. One or more non-transitory computer-readable media storing instructions executable by a processor, wherein the instructions, when executed, cause the processor to perform operations comprising: receiving data representing a three-dimensional simulated environment; generating a two-dimensional view of the three-dimensional simulated environment; determining a first metadata and second metadata associated with a region of the two-dimensional view; determining first sensor data based at least in part on the two-dimensional view, wherein the first sensor data includes the first metadata; providing the first sensor data to a first simulated sensor configured to detect the first metadata; determining second sensor data based at least in part on the two-dimensional view, wherein the second sensor data includes the second metadata; and providing the second sensor data to a second simulated sensor configured to detect the second metadata.

O. The one or more non-transitory computer-readable media of paragraph N, wherein: determining the first sensor data comprises generating a first reprojection of the two-dimensional view based at least in part on a first sensor location of the first simulated sensor within the three-dimensional simulated environment; and determining the second sensor data comprises generating a second reprojection of the two-dimensional view based at least in part on a second sensor location of the second simulated sensor within the three-dimensional simulated environment, wherein the first sensor location is different from the second sensor location.

P. The one or more non-transitory computer-readable media of paragraph N, wherein: generating the first sensor data comprises generating a first reprojection of the two-dimensional view based at least in part on a first simulated sensor time associated with the first simulated sensor; and generating the second sensor data comprises generating a second reprojection of the two-dimensional view based at least in part on a second simulated sensor time associated with the second simulated sensor, wherein the first simulated sensor time is different from the second simulated sensor time.

Q. The one or more non-transitory computer-readable media of paragraph N, wherein: the first simulated sensor includes a camera, and the first metadata includes light data associated with the region of the two-dimensional view; and the second simulated sensor includes at least one of a lidar sensor or a radar sensor, and the second metadata includes at least one of velocity data or material data associated with the region of the two-dimensional view.

R. The one or more non-transitory computer-readable media of paragraph N, wherein generating the first sensor data comprises: determining a first sensor location associated with the first simulated sensor within the three-dimensional simulated environment; and generating a reprojection of the two-dimensional view, based at least in part on a difference between the first sensor location and a view focal point location associated with the two-dimensional view, wherein generating the two-dimensional view comprises performing a rasterization process, and wherein generating the reprojection of the two-dimensional view comprises performing a ray casting process.

S. The one or more non-transitory computer-readable media of paragraph N, wherein determining the first sensor data comprises: determining a first simulated sensor time associated with the first simulated sensor; and generating a reprojection of the two-dimensional view, based at least in part on a time difference between the first simulated sensor time and a time associated with generating the two-dimensional view, wherein generating the two-dimensional view comprises performing a rasterization process, and wherein generating the reprojection of the two-dimensional view comprises performing a ray casting process.

T. The one or more non-transitory computer-readable media of paragraph S, the operations further comprising: determining a first movement of the first simulated sensor within the three-dimensional simulated environment, during a time period associated with the time difference; and determining a second movement of a simulated object represented within the two-dimensional view, during the time period, wherein generating the reprojection of the two-dimensional view is further based at least in part on the first movement and the second movement.

U. A system comprising: one or more processors; and one or more computer-readable media storing computer-executable instructions that, when executed, cause the one or more processors to perform operations comprising: receiving data representing a simulated environment; generating a two-dimensional view of the simulated environment, wherein the two-dimensional view is associated with a view focal point location within the simulated environment; determining a first sensor location associated with a first simulated sensor in the simulated environment, and a second sensor location associated with a second simulated sensor in the simulated environment, wherein the second sensor location is different from the first sensor location; determining a first spatial difference between the view focal point location and the first sensor location within the simulated environment; determining a second spatial difference between the view focal point location and the second sensor location within the simulated environment; generating a first reprojection based at least in part on the two-dimensional view and the first spatial difference; generating a second reprojection based at least in part on the two-dimensional view and the second spatial difference; determining first sensor data associated with the first simulated sensor, based at least in part on the first reprojection; and determining second sensor data associated with the second simulated sensor, based at least in part on the second reprojection.

V. The system of paragraph U, the operations further comprising: determining a first execution rate associated with the first simulated sensor; and determining a second execution rate associated with the second simulated sensor, wherein the first execution rate is different from the second execution rate.

W. The system of paragraph U, the operations further comprising: generating a second two-dimensional view of the simulated environment, wherein the two-dimensional view is oriented at a first angle and the second two-dimensional view is oriented at a second angle different from the first angle, wherein the second two-dimensional view is associated with a second view focal point location; determining a third spatial difference between the second view focal point location and the first sensor location within the simulated environment; and generating a third reprojection based at least in part on the second two-dimensional view and the third spatial difference, wherein a first portion of the first sensor data is determined based on the first reprojection of the two-dimensional view, and a second portion of the first sensor data is determined based on the third reprojection of the second two-dimensional view.

X. The system of paragraph U, the operations further comprising: determining a first orientation of the first simulated sensor at a first time during a simulation, wherein generating the first reprojection of the two-dimensional view is based at least in part on the first orientation; determining a second orientation of the first simulated sensor, at a second time during the simulation after the first time; determining a second two-dimensional view, based at least in part on the second orientation; determining third sensor data associated with the first simulated sensor, based at least in part on a third reprojection of the second two-dimensional view; and determining the third sensor data associated with the first simulated sensor, for a time during the simulation associated with the second time.

Y. The system of paragraph U, the operations further comprising: determining a rendering time associated with generating the two-dimensional view; and determining a simulated sensor time associated with the first simulated sensor, wherein generating the first reprojection is based at least in part on a time difference between the rendering time associated with generating the two-dimensional view and the simulated sensor time associated with the first simulated sensor.

Z. A method comprising: receiving data representing a simulated environment; determining a first field of view of a first simulated sensor within the simulated environment; generating first sensor data for the first simulated sensor based at least in part on the first field of view; determining a second field of view of a second simulated sensor within the simulated environment, wherein the second field of view at least partially overlaps with the first field of view; and generating second sensor data for the second simulated sensor based at least in part on the second field of view, wherein the second sensor data is based at least in part on the first sensor data.

AA. The method of paragraph Z, further comprising: generating a two-dimensional view of the simulated environment, using a rasterization process, wherein generating the first sensor data includes generating a first reprojection of the two-dimensional view, based at least in part on the first field of view, and wherein generating the second sensor data includes generating a second reprojection of the two-dimensional view, based at least in part on the second field of view.

AB. The method of paragraph AA, wherein generating the first reprojection comprises generating an image based at least in part on light data stored within the two-dimensional view; and wherein generating the second reprojection comprises generating a point cloud based at least in part on depth data stored within the two-dimensional view.

AC. The method of paragraph AA, wherein the two-dimensional view is associated with a view focal point location within the simulated environment, wherein generating the first reprojection comprises determining a first spatial difference between the view focal point location and a first sensor pose within the simulated environment, and executing a first ray casting process based at least in part on the first spatial difference, and wherein generating the second reprojection comprises determining a second spatial difference between the view focal point location and a second sensor pose within the simulated environment, and executing a second ray casting process based at least in part on the second spatial difference.

AD. The method of paragraph Z, further comprising: determining a first simulation time associated with the first sensor data; and determining a second simulation time associated with the second sensor data, wherein the first simulation time is different from the second simulation time.

AE. The method of paragraph AD, further comprising: rendering a two-dimensional view of the simulated environment, wherein the two-dimensional view is associated with a rendering time within a simulation, wherein generating the first sensor data includes generating a first reprojection of the two-dimensional view, based at least in part on the rendering time and the first simulation time, and wherein generating the second sensor data includes generating a second reprojection of the two-dimensional view, based at least in part on the rendering time and the second simulation time.

AF. The method of paragraph Z, further comprising: rendering a first view of the simulated environment, wherein the first view is orientated at a first angle and is associated with a first focal point location in the simulated environment; and rendering a second view of the simulated environment, wherein the second view is orientated at a second angle and is associated with a second focal point location in the simulated environment, wherein generating the first sensor data comprises determining a first portion of the first sensor data based on the first view, and determining a second portion of the first sensor data based on the second view.

AG. The method of paragraph Z, wherein generating the first sensor data comprises: rendering a two-dimensional view of the simulated environment, using a rasterization process, wherein the two-dimensional view is associated with a view focal point location in the simulated environment and a rendering time; determining a spatial difference between the view focal point location and a first sensor pose associated with the first sensor; determining a temporal difference between the rendering time and a first simulation time associated with the first sensor; and generating a reprojection of the two-dimensional view, based at least in part on the spatial difference and the temporal difference.

AH. One or more non-transitory computer-readable media storing instructions executable by a processor, wherein the instructions, when executed, cause the processor to perform operations comprising: receiving data representing a simulated environment; determining a first field of view of a first simulated sensor within the simulated environment; generating first sensor data for the first simulated sensor based at least in part on the first field of view; determining a second field of view of a second simulated sensor within the simulated environment, wherein the second field of view at least partially overlaps with the first field of view; and generating second sensor data for the second simulated sensor based at least in part on the second field of view, wherein the second sensor data is based at least in part on the first sensor data.

AI. The one or more non-transitory computer-readable media of paragraph AH, the operations further comprising: generating a two-dimensional view of the simulated environment, using a rasterization process, wherein generating the first sensor data includes generating a first reprojection of the two-dimensional view, based at least in part on the first field of view, and wherein generating the second sensor data includes generating a second reprojection of the two-dimensional view, based at least in part on the second field of view.

AJ. The one or more non-transitory computer-readable media of paragraph AI, wherein generating the first reprojection comprises generating an image based at least in part on light data stored within the two-dimensional view; and wherein generating the second reprojection comprises generating a point cloud based at least in part on depth data stored within the two-dimensional view.

AK. The one or more non-transitory computer-readable media of paragraph AI, wherein the two-dimensional view is associated with a view focal point location within the simulated environment, wherein generating the first reprojection comprises determining a first spatial difference between the view focal point location and a first sensor pose within the simulated environment, and executing a first ray casting process based at least in part on the first spatial difference, and wherein generating the second reprojection comprises determining a second spatial difference between the view focal point location and a second sensor pose within the simulated environment, and executing a second ray casting process based at least in part on the second spatial difference.

AL. The one or more non-transitory computer-readable media of paragraph AH, the operations further comprising: determining a first simulation time associated with the first sensor data; and determining a second simulation time associated with the second sensor data, wherein the first simulation time is different from the second simulation time.

AM. The one or more non-transitory computer-readable media of paragraph AL, the operations further comprising: rendering a two-dimensional view of the simulated environment, wherein the two-dimensional view is associated with a rendering time within a simulation, wherein generating the first sensor data includes generating a first reprojection of the two-dimensional view, based at least in part on the rendering time and the first simulation time, and wherein generating the second sensor data includes generating a second reprojection of the two-dimensional view, based at least in part on the rendering time and the second simulation time.

AN. The one or more non-transitory computer-readable media of paragraph AM, the operations further comprising: rendering a first view of the simulated environment, wherein the first view is orientated at a first angle and is associated with a first focal point location in the simulated environment; and rendering a second view of the simulated environment, wherein the second view is orientated at a second angle and is associated with a second focal point location in the simulated environment, wherein generating the first sensor data comprises determining a first portion of the first sensor data based on the first view, and determining a second portion of the first sensor data based on the second view.

AO. A system comprising: one or more processors; and one or more computer-readable media storing computer-executable instructions that, when executed, cause the one or more processors to perform operations comprising: receiving a two-dimensional view associated with a simulated environment; determining a sensor pose associated with a simulated sensor within the simulated environment; determining a ray intersection point within the two-dimensional view, using a ray casting process, based at least in part on the sensor pose; determining a first region and a second region within the two-dimensional view, based at least in part on the ray intersection point; receiving, from the two-dimensional view, a first depth value associated with the first region and a second depth value associated with the second region; determining a physical property associated with the ray intersection point, based at least in part on a comparison between the first depth value and the second depth value; and providing sensor data to a simulated vehicle within the simulated environment, wherein the sensor data includes the physical property associated with the ray intersection point.

AP. The system of paragraph AO, wherein determining a physical property associated with the ray intersection point comprises: determining a first sample of the physical property associated with the first region; determining a second sample of the physical property associated with the second region; comparing a difference between the first depth value and the second depth value to a threshold; when the difference is less than the threshold, using a linear interpolation process based at least in part on the first sample and the second sample to determine the physical property associated with the ray intersection point; and when the difference meets or exceeds the threshold, selecting one of the first sample or the second sample to determine the physical property associated with the ray intersection point.

AQ. The system of paragraph AO, the operations further comprising: determining a first object identifier associated with the first region; and determining a second object identifier associated with second region, wherein determining the physical property associated with the ray intersection point is further based at least in part on a second comparison between the first object identifier and the second object identifier.

AR. The system of paragraph AO, the operations further comprising: determining a second sensor pose of the simulated sensor within the simulated environment, wherein the sensor pose is associated with a first time during a simulation and the second sensor pose is associated with a second time after the first time during the simulation; and determining a second ray intersection point within the two-dimensional view, using a second ray casting process, based at least in part on the second sensor pose, wherein the first region is associated with the ray intersection point, and wherein the second region is associated with the second ray intersection point.

AS. The system of paragraph AO, the operations further comprising: determining a first sample of the physical property associated with the first region, by retrieving the first sample from a first storage location of the two-dimensional view associated with the first region; and determining a second sample of the physical property associated with the second region, by retrieving the second sample from a second storage location of the two-dimensional view associated with the first region, wherein the physical property includes at least one of a light property, a velocity property, a material property, or a reflectance property.

AT. A method comprising: receiving a two-dimensional view associated with a simulated environment; determining a sensor pose of a simulated sensor within the simulated environment; determining a ray intersection point within the two-dimensional view, using a ray casting process, based at least in part on the sensor pose; determining a region of the two-dimensional view, associated with the ray intersection point; determining an attribute value associated with the region of the two-dimensional view, wherein the attribute value includes at least one of a depth value, an object identifier, or a velocity value; determining a value of a physical property associated with the ray intersection point, based at least in part on the attribute value; and determining sensor data associated with the simulated sensor, wherein the sensor data includes the value of the physical property.

AU. The method of paragraph AT, further comprising: determining a second region of the two-dimensional view; and determining a second attribute value associated with the second region of the two-dimensional view, wherein determining the value of the physical property associated with the ray intersection point is based at least in part on comparing the attribute value associated with the region and the second attribute value associated with the second region.

AV. The method of paragraph AU, further comprising: determining that a difference between the attribute value and the second attribute value is less than a threshold; and based on determining that the difference is less than the threshold: determining a second value of the physical property associated with the region; determining a third value of the physical property associated with the second region; and performing a linear interpolation process including at least the second value and the third value, wherein the value of the physical property associated with the ray intersection point is determined based on the linear interpolation process.

AW. The method of paragraph AU, further comprising: determining that a difference between the attribute value and the second attribute value meets or exceeds a threshold; and based on determining that the difference meets or exceeds the threshold: determining either the region or the second region as a spatially closer region to the ray intersection point within the two-dimensional view; determining a second value of the physical property associated with the spatially closer region; and determining the value of the physical property associated with the ray intersection point as the second value of the physical property associated with the spatially closer region.

AX. The method of paragraph AU, further comprising: determining a second sensor pose of the simulated sensor within the simulated environment, wherein the sensor pose is associated with a first time during a simulation and the second sensor pose is associated with a second time after the first time during the simulation; and determining a second ray intersection point within the two-dimensional view, using a second ray casting process, based at least in part on the second sensor pose, wherein the region is associated with the ray intersection point, and wherein the second region is associated with the second ray intersection point.

AY. The method of paragraph AX, further comprising: determining a distance within the two-dimensional view, between the ray intersection point and the second ray intersection point, wherein determining the value of the physical property associated with the ray intersection point is further based at least in part on the distance.

AZ. The method of paragraph AT, further comprising: determining a second region of the two-dimensional view, wherein the second region is adjacent to the region; determining a second attribute value associated with the second region; determining a third region of the two-dimensional view, wherein the third region is adjacent to the region, on a different side of the region from the second region; and determining a third attribute value associated with the third region, wherein determining the value of the physical property associated with the ray intersection point is based at least in part on comparing the attribute value, the second attribute value, and the third attribute value.

BA. The method of paragraph AT, further comprising: determining a second value of the physical property associated with the region, wherein the physical property includes at least one of a light property, a velocity property, a material property, or a reflectance property, wherein determining the value of the physical property associated with the ray intersection point is based at least in part on the second value of the physical property associated with the region.

BB. One or more non-transitory computer-readable media storing instructions executable by a processor, wherein the instructions, when executed, cause the processor to perform operations comprising: receiving a two-dimensional view associated with a simulated environment; determining a sensor pose of a simulated sensor within the simulated environment; determining a ray intersection point within the two-dimensional view, using a ray casting process, based at least in part on the sensor pose; determining a region of the two-dimensional view, associated with the ray intersection point; determining an attribute value associated with the region of the two-dimensional view, wherein the attribute value includes at least one of a depth value, an object identifier, or a velocity value; determining a value of a physical property associated with the ray intersection point, based at least in part on the attribute value; and determining sensor data associated with the simulated sensor, wherein the sensor data includes the value of the physical property.

BC. The one or more non-transitory computer-readable media of paragraph BB, the operations further comprising: determining a second region of the two-dimensional view; and determining a second attribute value associated with the second region of the two-dimensional view, wherein determining the value of the physical property associated with the ray intersection point is based at least in part on comparing the attribute value associated with the region and the second attribute value associated with the second region.

BD. The one or more non-transitory computer-readable media of paragraph BC, the operations further comprising: determining that a difference between the attribute value and the second attribute value is less than a threshold; and based on determining that the difference is less than the threshold: determining a second value of the physical property associated with the region; determining a third value of the physical property associated with the second region; and performing a linear interpolation process including at least the second value and the third value, wherein the value of the physical property associated with the ray intersection point is determined based on the linear interpolation process.

BE. The one or more non-transitory computer-readable media of paragraph BC, the operations further comprising: determining that a difference between the attribute value and the second attribute value meets or exceeds a threshold; and based on determining that the difference meets or exceeds the threshold: determining either the region or the second region as a spatially closer region to the ray intersection point within the two-dimensional view; determining a second value of the physical property associated with the spatially closer region; and determining the value of the physical property associated with the ray intersection point as the second value of the physical property associated with the spatially closer region.

BF. The one or more non-transitory computer-readable media of paragraph BC, the operations further comprising: determining a second sensor pose of the simulated sensor within the simulated environment, wherein the sensor pose is associated with a first time during a simulation and the second sensor pose is associated with a second time after the first time during the simulation; and determining a second ray intersection point within the two-dimensional view, using a second ray casting process, based at least in part on the second sensor pose, wherein the region is associated with the ray intersection point, and wherein the second region is associated with the second ray intersection point.

BG. The one or more non-transitory computer-readable media of paragraph BF, the operations further comprising: determining a distance within the two-dimensional view, between the ray intersection point and the second ray intersection point, wherein determining the value of the physical property associated with the ray intersection point is further based at least in part on the distance.

BH. The one or more non-transitory computer-readable media of paragraph BB, the operations further comprising: determining a second region of the two-dimensional view, wherein the second region is adjacent to the region; determining a second attribute value associated with the second region; determining a third region of the two-dimensional view, wherein the third region is adjacent to the region, on a different side of the region from the second region; and determining a third attribute value associated with the third region, wherein determining the value of the physical property associated with the ray intersection point is based at least in part on comparing the attribute value, the second attribute value, and the third attribute value.

BI. A system comprising: one or more processors; and one or more computer-readable media storing computer-executable instructions that, when executed, cause the one or more processors to perform operations comprising: receiving data representing a three-dimensional simulated environment associated with a driving simulation; determining a first sensor and a second sensor associated with a simulated vehicle in the three-dimensional simulated environment, the first sensor having a first location and first orientation within the three-dimensional simulated environment, and the second sensor having a second location different from the first location and a second orientation different from the first orientation within the three-dimensional simulated environment; determining a first view of the three-dimensional simulated environment associated with the first sensor, based at least in part on the first location and the first orientation; determining a second view of the three-dimensional simulated environment associated with the second sensor, based at least in part on the second location and the second orientation; determining a first data requirement and a first simulation time associated with the first sensor; determining a second data requirement and a second simulation time associated with the second sensor; determining a rendering time for a graphics processing unit (GPU) associated with the driving simulation; determining a view to be updated at a time associated with the rendering time, wherein the view to be updated is one of the first view or the second view, and wherein the determining is based at least in part on the first data requirement, the second data requirement, the first simulation time, and the second simulation time; and generating an updated rendering of the view to be updated, using the GPU, at the time associated with the rendering time.

BJ. The system of paragraph BI, wherein: determining the first data requirement associated with the first sensor comprises determining a first type of sensor data that the first sensor is configured to receive; and determining the second data requirement associated with the second sensor comprises determining a second type of sensor data that the second sensor is configured to receive, wherein the second type of sensor data is different from the first type of sensor data.

BK. The system of paragraph BI, the operations further comprising: determining a direction of movement of the simulated vehicle within the three-dimensional simulated environment, wherein determining the view to be updated is further based on the first orientation, the second orientation, and the direction of movement.

BL. The system of paragraph BI, wherein determining the view to be updated comprises: determining a first sensor field of view associated with the first sensor; determining a second sensor field of view associated with the second sensor; and determining that the view to be updated includes both the first sensor field of view and the second sensor field of view.

BM. The system of paragraph BI, wherein determining the view to be updated comprises at least one of: comparing a first number of dynamic simulated objects represented in the first view, to a second number of dynamic simulated objects represented in the second view; or comparing a first velocity of a first simulated object represented in the first view, to a second velocity of a second simulated object represented in the second view.

BN. A method comprising: determining a first sensor associated with a first view of a three-dimensional simulated environment; determining a second sensor associated with a second view of the three-dimensional simulated environment; determining a first data requirement and a first simulation time associated with the first sensor; determining a second data requirement and a second simulation time associated with the second sensor; determining a rendering time for a GPU associated with the three-dimensional simulated environment; determining a view to be updated at a time associated with the rendering time, wherein the view to be updated is one of the first view or the second view, and wherein the determining the view is based at least in part on the first data requirement, the second data requirement, the first simulation time, and the second simulation time; and generating the view to be updated, using the GPU, at the time associated with the rendering time.

BO. The method of paragraph BN, wherein: determining the first data requirement associated with the first sensor comprises determining a first sensor field of view based at least in part on a first location and a first orientation of the first sensor within the three-dimensional simulated environment; and determining the second data requirement associated with the second sensor comprises determining a second sensor field of view based at least in part on a second location and a second orientation of the second sensor within the three-dimensional simulated environment, wherein the second sensor field of view is different from the first sensor field of view.

BP. The method of paragraph BN, wherein: determining the first data requirement associated with the first sensor comprises determining a first type of sensor data that the first sensor is configured to receive; and determining the second data requirement associated with the second sensor comprises determining a second type of sensor data that the second sensor is configured to receive, wherein the second type of sensor data is different from the first type of sensor data.

BQ. The method of paragraph BN, further comprising: determining a first orientation angle of the first sensor within the three-dimensional simulated environment, and a second orientation angle of the second sensor within the three-dimensional simulated environment; and determining a direction of movement of at least one of the first sensor and the second sensor within the three-dimensional simulated environment, wherein determining the view to be updated is further based on the first orientation angle, the second orientation angle, and the direction of movement.

BR. The method of paragraph BN, further comprising: determining a first execution rate associated with the first sensor, and a second execution rate associated with the second sensor; and determining a rendering rate associated with the GPU, wherein determining the view to be updated is further based on the first execution rate, the second execution rate, and the rendering rate associated with the GPU.

BS. The method of paragraph BR, further comprising: determining a GPU latency associated with the GPU, wherein determining the view to be updated is further based on the GPU latency.

BT. The method of paragraph BN, wherein determining the view to be updated comprises: determining a first sensor field of view associated with the first sensor; determining a second sensor field of view associated with the second sensor; and determining that the view to be updated includes both the first sensor field of view and the second sensor field of view.

BU. The method of paragraph BN, wherein determining the view to be updated comprises at least one of: comparing a first number of dynamic simulated objects represented in the first view, to a second number of dynamic simulated objects represented in the second view; or comparing a first velocity of a first simulated object represented in the first view, to a second velocity of a second simulated object represented in the second view.

BV. One or more non-transitory computer-readable media storing instructions executable by a processor, wherein the instructions, when executed, cause the processor to perform operations comprising: determining a first sensor associated with a first view of a three-dimensional simulated environment; determining a second sensor associated with a second view of the three-dimensional simulated environment; determining a first data requirement and a first simulation time associated with the first sensor; determining a second data requirement and a second simulation time associated with the second sensor; determining a rendering time for a GPU associated with the three-dimensional simulated environment; determining a view to be updated at a time associated with the rendering time, wherein the view to be updated is one of the first view or the second view, and wherein the determining the view is based at least in part on the first data requirement, the second data requirement, the first simulation time, and the second simulation time; and generating the view to be updated, using the GPU, at the time associated with the rendering time.

BW. The one or more non-transitory computer-readable media of paragraph BV, wherein: determining the first data requirement associated with the first sensor comprises determining a first sensor field of view based at least in part on a first location and a first orientation of the first sensor within the three-dimensional simulated environment; and determining the second data requirement associated with the second sensor comprises determining a second sensor field of view based at least in part on a second location and a second orientation of the second sensor within the three-dimensional simulated environment, wherein the second sensor field of view is different from the first sensor field of view.

BX. The one or more non-transitory computer-readable media of paragraph BV, wherein: determining the first data requirement associated with the first sensor comprises determining a first type of sensor data that the first sensor is configured to receive; and determining the second data requirement associated with the second sensor comprises determining a second type of sensor data that the second sensor is configured to receive, wherein the second type of sensor data is different from the first type of sensor data.

BY. The one or more non-transitory computer-readable media of paragraph BV, the operations further comprising: determining a first orientation angle of the first sensor within the three-dimensional simulated environment, and a second orientation angle of the second sensor within the three-dimensional simulated environment; and determining a direction of movement of at least one of the first sensor and the second sensor within the three-dimensional simulated environment, wherein determining the view to be updated is further based on the first orientation angle, the second orientation angle, and the direction of movement.

BZ. The one or more non-transitory computer-readable media of paragraph BV, the operations further comprising: determining a first execution rate associated with the first sensor, and a second execution rate associated with the second sensor; and determining a rendering rate associated with the GPU, wherein determining the view to be updated is further based on the first execution rate, the second execution rate, and the rendering rate associated with the GPU.

CA. The one or more non-transitory computer-readable media of paragraph BV, wherein determining the view to be updated comprises: determining a first sensor field of view associated with the first sensor; determining a second sensor field of view associated with the second sensor; and determining that the view to be updated includes both the first sensor field of view and the second sensor field of view.

CB. The one or more non-transitory computer-readable media of paragraph BV, wherein determining the view to be updated comprises at least one of: comparing a first number of dynamic simulated objects represented in the first view, to a second number of dynamic simulated objects represented in the second view; or comparing a first velocity of a first simulated object represented in the first view, to a second velocity of a second simulated object represented in the second view.

While the example clauses described above are described with respect to particular implementations, it should be understood that, in the context of this document, the content of the example clauses can be implemented via a method, device, system, a computer-readable medium, and/or another implementation. Additionally, any of examples A-CB may be implemented alone or in combination with any other one or more of the examples A-CB.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing blocks, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
   receiving a two-dimensional view associated with a simulated environment;
   determining a sensor pose of a simulated sensor within the simulated environment;
   determining a ray intersection point within the two-dimensional view, using a ray casting process, based at least in part on the sensor pose;
   determining a region of the two-dimensional view, based at least in part on the ray intersection point;
   determining an attribute value associated with the region of the two-dimensional view, wherein the attribute value includes at least one of a depth value, an object identifier, or a velocity value;
   determining a second region of the two-dimensional view and a third region of the two-dimensional view, wherein the second region is adjacent to the region, and wherein the third region is adjacent to the region and on a different side of the region from the second region;
   determining a second attribute value associated with the second region, and a third attribute value associated with the third region;
   determining a value of a physical property associated with the ray intersection point, based at least in part on comparing the attribute value associated with the region, the second attribute value associated with the second region, and the third attribute value associated with the third region; and
   determining sensor data associated with the simulated sensor, wherein the sensor data includes the value of the physical property.

2. The method of claim 1, further comprising:
   determining that a difference between the attribute value and the second attribute value is less than a threshold; and
   based on determining that the difference is less than the threshold:
      determining a second value of the physical property associated with the region;
      determining a third value of the physical property associated with the second region; and
      performing a linear interpolation process including at least the second value and the third value,
      wherein the value of the physical property associated with the ray intersection point is determined based on the linear interpolation process.

3. The method of claim 1, further comprising:
   determining that a difference between the attribute value and the second attribute value meets or exceeds a threshold; and
   based on determining that the difference meets or exceeds the threshold:
      determining either the region or the second region as a spatially closer region to the ray intersection point within the two-dimensional view;
      determining a second value of the physical property associated with the spatially closer region; and
      determining the value of the physical property associated with the ray intersection point as the second value of the physical property associated with the spatially closer region.

4. The method of claim 1, further comprising:
   determining a second sensor pose of the simulated sensor within the simulated environment, wherein the sensor pose is associated with a first time during a simulation and the second sensor pose is associated with a second time after the first time during the simulation; and
   determining a second ray intersection point within the two-dimensional view, using a second ray casting process, based at least in part on the second sensor pose, wherein the region is associated with the ray intersection point, and wherein the second region is associated with the second ray intersection point.

5. The method of claim 4, further comprising:
   determining a distance within the two-dimensional view, between the ray intersection point and the second ray intersection point,
   wherein determining the value of the physical property associated with the ray intersection point is further based at least in part on the distance.

6. The method of claim 1, further comprising:
   determining a second value of the physical property associated with the region, wherein the physical property includes at least one of a light property, a velocity property, a material property, or a reflectance property,
   wherein determining the value of the physical property associated with the ray intersection point is based at least in part on the second value of the physical property associated with the region.

7. One or more non-transitory computer-readable media storing instructions executable by a processor, wherein the instructions, when executed, cause the processor to perform operations comprising:
  receiving a two-dimensional view associated with a simulated environment;
  determining a sensor pose of a simulated sensor within the simulated environment;
  determining a ray intersection point within the two-dimensional view, using a ray casting process, based at least in part on the sensor pose;
  determining a region of the two-dimensional view, based at least in part on the ray intersection point;
  determining an attribute value associated with the region of the two-dimensional view, wherein the attribute value includes at least one of a depth value, an object identifier, or a velocity value;
  determining a second region of the two-dimensional view, and a second attribute value associated with the second region of the two-dimensional view;
  determining a value of a physical property associated with the ray intersection point, based at least in part on the attribute value associated with the region, wherein determining the value of the physical property associated with the ray intersection point is based at least in part on comparing the attribute value associated with the region and the second attribute value associated with the second region, and wherein determining the value of a physical property comprises:
    determining that a difference between the attribute value and the second attribute value meets or exceeds a threshold, and based on determining that the difference meets or exceeds the threshold:
      determining either the region or the second region as a spatially closer region to the ray intersection point within the two-dimensional view;
      determining a second value of the physical property associated with the spatially closer region; and
      determining the value of the physical property associated with the ray intersection point as the second value of the physical property associated with the spatially closer region; and
  determining sensor data associated with the simulated sensor, wherein the sensor data includes the value of the physical property.

8. The one or more non-transitory computer-readable media of claim 7, the operations further comprising:
  determining a second sensor pose of the simulated sensor within the simulated environment, wherein the sensor pose is associated with a first time during a simulation and the second sensor pose is associated with a second time after the first time during the simulation; and
  determining a second ray intersection point within the two-dimensional view, using a second ray casting process, based at least in part on the second sensor pose, wherein the region is associated with the ray intersection point, and wherein the second region is associated with the second ray intersection point.

9. The one or more non-transitory computer-readable media of claim 8, the operations further comprising:
  determining a distance within the two-dimensional view, between the ray intersection point and the second ray intersection point,
  wherein determining the value of the physical property associated with the ray intersection point is further based at least in part on the distance.

10. The one or more non-transitory computer-readable media of claim 7, the operations further comprising:
  determining a third region of the two-dimensional view, wherein the third region is adjacent to the region, on a different side of the region from the second region; and
  determining a third attribute value associated with the third region,
  wherein determining the value of the physical property associated with the ray intersection point is based at least in part on comparing the attribute value, the second attribute value, and the third attribute value.

11. One or more non-transitory computer-readable media storing instructions executable by a processor, wherein the instructions, when executed, cause the processor to perform operations comprising:
  receiving a two-dimensional view associated with a simulated environment;
  determining a sensor pose of a simulated sensor within the simulated environment;
  determining a ray intersection point within the two-dimensional view, using a ray casting process, based at least in part on the sensor pose;
  determining a region of the two-dimensional view, based at least in part on the ray intersection point;
  determining an attribute value associated with the region of the two-dimensional view, wherein the attribute value includes at least one of a depth value, an object identifier, or a velocity value;
  determining a second region of the two-dimensional view and a third region of the two-dimensional view, wherein the second region is adjacent to the region, and wherein the third region is adjacent to the region and on a different side of the region from the second region;
  determining a second attribute value associated with the second region, and a third attribute value associated with the third region;
  determining a value of a physical property associated with the ray intersection point, based at least in part on comparing the attribute value associated with the region, the second attribute value associated with the second region, and the third attribute value associated with the third region; and
  determining sensor data associated with the simulated sensor, wherein the sensor data includes the value of the physical property.

12. The one or more non-transitory computer-readable media of claim 11, the operations further comprising:
  determining that a difference between the attribute value and the second attribute value is less than a threshold; and
  based on determining that the difference is less than the threshold:
    determining a second value of the physical property associated with the region;
    determining a third value of the physical property associated with the second region; and
    performing a linear interpolation process including at least the second value and the third value,
    wherein the value of the physical property associated with the ray intersection point is determined based on the linear interpolation process.

13. The one or more non-transitory computer-readable media of claim 11, the operations further comprising:
  determining that a difference between the attribute value and the second attribute value meets or exceeds a threshold; and based on determining that the difference meets or exceeds the threshold:
  determining either the region or the second region as a spatially closer region to the ray intersection point within the two-dimensional view;
  determining a second value of the physical property associated with the spatially closer region; and
  determining the value of the physical property associated with the ray intersection point as the second value of the physical property associated with the spatially closer region.

14. The one or more non-transitory computer-readable media of claim 11, the operations further comprising:
  determining a second sensor pose of the simulated sensor within the simulated environment, wherein the sensor pose is associated with a first time during a simulation and the second sensor pose is associated with a second time after the first time during the simulation; and
  determining a second ray intersection point within the two-dimensional view, using a second ray casting process, based at least in part on the second sensor pose, wherein the region is associated with the ray intersection point, and wherein the second region is associated with the second ray intersection point.

15. The one or more non-transitory computer-readable media of claim 14, the operations further comprising:
  determining a distance within the two-dimensional view, between the ray intersection point and the second ray intersection point,
  wherein determining the value of the physical property associated with the ray intersection point is further based at least in part on the distance.

16. The one or more non-transitory computer-readable media of claim 11, the operations further comprising:
  determining a second value of the physical property associated with the region, wherein the physical property includes at least one of a light property, a velocity property, a material property, or a reflectance property,
  wherein determining the value of the physical property associated with the ray intersection point is based at least in part on the second value of the physical property associated with the region.

* * * * *